United States Patent
Doi et al.

(10) Patent No.: US 12,260,545 B2
(45) Date of Patent: Mar. 25, 2025

(54) SAMPLE OBSERVATION DEVICE AND METHOD

(71) Applicant: Hitachi High-Tech Corporation, Tokyo (JP)

(72) Inventors: Yuki Doi, Tokyo (JP); Naoaki Kondo, Tokyo (JP); Minoru Harada, Tokyo (JP); Hideki Nakayama, Tokyo (JP); Yohei Minekawa, Tokyo (JP); Yuji Takagi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 309 days.

(21) Appl. No.: 17/840,798

(22) Filed: Jun. 15, 2022

(65) Prior Publication Data

US 2022/0405905 A1    Dec. 22, 2022

(30) Foreign Application Priority Data

Jun. 22, 2021   (JP) ................................. 2021-103285

(51) Int. Cl.
*G06T 7/00* (2017.01)
*G01N 21/95* (2006.01)
*G06T 7/73* (2017.01)

(52) U.S. Cl.
CPC ......... *G06T 7/001* (2013.01); *G01N 21/9505* (2013.01); *G06T 7/74* (2017.01);
(Continued)

(58) Field of Classification Search
None
See application file for complete search history.

(56) References Cited

U.S. PATENT DOCUMENTS

| 9,483,819 | B2 | 11/2016 | Chen et al. |
| 9,685,301 | B2 | 6/2017 | Hirai et al. |

(Continued)

FOREIGN PATENT DOCUMENTS

| JP | 2009250645 A | 10/2009 |
| JP | 2018-028636 A | 2/2018 |

(Continued)

OTHER PUBLICATIONS

Office Action mailed Feb. 2, 2023 in Taiwanese Application No. 111121399.

(Continued)

*Primary Examiner* — Delomia L Gilliard
(74) *Attorney, Agent, or Firm* — Miles & Stockbridge, P.C.

(57) ABSTRACT

In learning processing performed before sample observation processing (steps S705 to S708), the sample observation device acquires a low-picture quality learning image under a first imaging condition for each defect position indicated by defect position information, determines an imaging count of a plurality of high-picture quality learning images associated with the low-picture quality learning image for each defect position and a plurality of imaging points based on a set value of the imaging count, acquires the plurality of high-picture quality learning images under a second imaging condition (step S702), learns a high-picture quality image estimation model using the low-picture quality learning image and the plurality of high-picture quality learning images (step S703), and adjusts a parameter related to the defect detection in the sample observation processing using the high-picture quality image estimation model (step S704).

16 Claims, 22 Drawing Sheets

(52) U.S. Cl.
CPC ............... *G06T 2207/20081* (2013.01); *G06T 2207/20092* (2013.01); *G06T 2207/20132* (2013.01); *G06T 2207/20212* (2013.01); *G06T 2207/30148* (2013.01); *G06T 2207/30168* (2013.01)

(56) References Cited

U.S. PATENT DOCUMENTS

| | | | |
|---|---|---|---|
| 10,559,074 | B2 | 2/2020 | Harada et al. |
| 11,010,665 | B2 | 5/2021 | Karlinsky et al. |
| 11,170,483 | B2 | 11/2021 | Harada et al. |
| 11,205,119 | B2 | 12/2021 | Karlinsky et al. |
| 11,348,001 | B2 | 5/2022 | Karlinsky et al. |
| 11,562,882 | B2 * | 1/2023 | Yamamoto ............ H01J 37/244 |
| 11,568,531 | B2 | 1/2023 | Shaubi et al. |
| 2009/0252403 | A1 | 10/2009 | Harada et al. |
| 2010/0128970 | A1 * | 5/2010 | Nakagaki ................ G06T 7/001 382/149 |
| 2012/0138796 | A1 * | 6/2012 | Sasajima ............... H01J 37/222 250/311 |
| 2015/0332445 | A1 * | 11/2015 | Harada ................... G06T 7/001 382/149 |
| 2018/0240225 | A1 * | 8/2018 | Harada ................... G06T 7/001 |
| 2020/0126201 | A1 * | 4/2020 | Harada ................... H01J 37/28 |
| 2021/0133989 | A1 * | 5/2021 | Bhattacharyya ...... G06T 7/0002 |
| 2022/0067523 | A1 | 3/2022 | Karlinsky et al. |

FOREIGN PATENT DOCUMENTS

| | | |
|---|---|---|
| JP | 2018-137275 A | 8/2018 |
| KR | 10-2020-0116926 A | 10/2020 |
| TW | 201421526 A | 6/2014 |
| TW | 201439526 A | 10/2014 |
| TW | 201732690 A | 9/2017 |
| TW | 201843692 A | 12/2018 |

OTHER PUBLICATIONS

Office Action mailed Jan. 3, 2025 in Korean Application No. 10-2022-0069913.

* cited by examiner

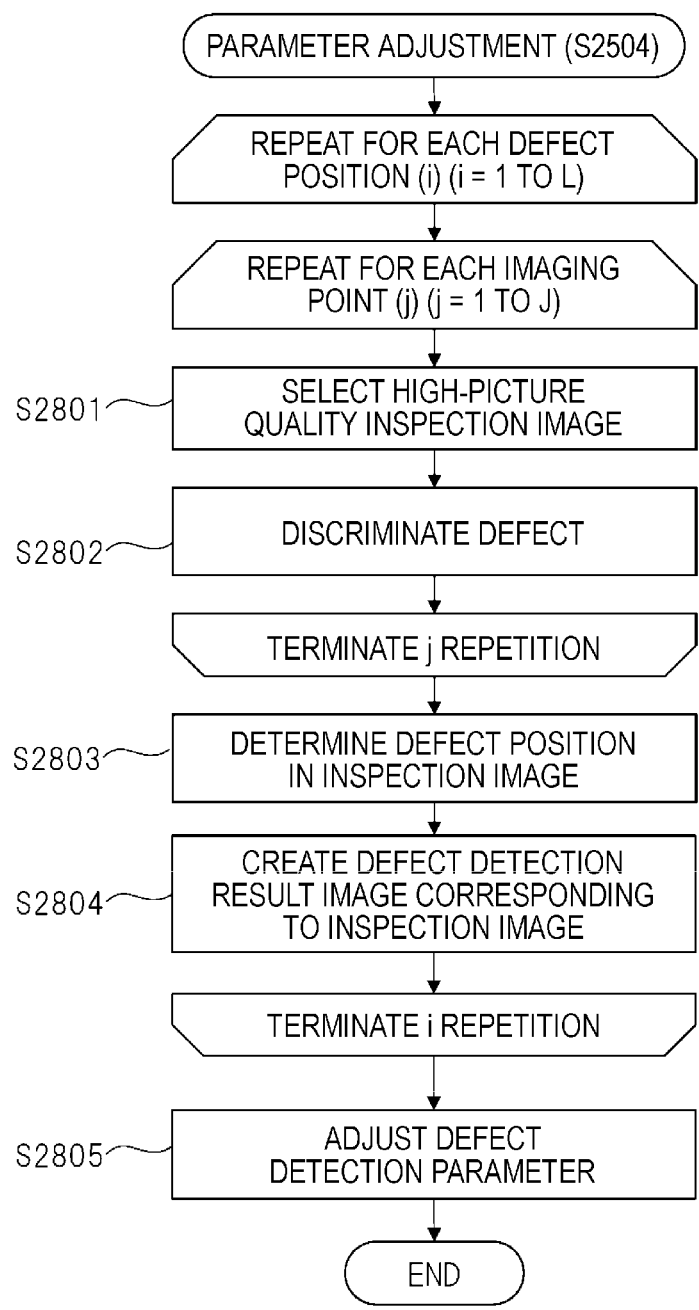

SAMPLE OBSERVATION DEVICE AND METHOD

BACKGROUND OF THE INVENTION

1. Field of the Invention

The present invention relates to a sample observation technique. As an example, the present invention relates to a device having a function of observing a defect, an abnormality, and so on (sometimes collectively referred to as defect) and a circuit pattern in a sample such as a semiconductor wafer.

2. Description of Related Art

In semiconductor wafer manufacturing, it is important for the purpose of ensuring profits to quickly start a manufacturing process and shift early to a high-yield mass production system. For this purpose, various inspection devices, observation devices, measuring devices, and so on are introduced in a production line. Defect inspection on a semiconductor wafer as a sample is performed in, for example, an inspection device, and coordinate information indicating a defect position on the surface of the semiconductor wafer is output from the inspection device as defect position information. A sample observation device images the defect position and part on the target semiconductor wafer with high resolution based on the defect position information. As an example of the sample observation device, a scanning electron microscope-based (SEM-based) observation device (also referred to as review SEM) is used.

Automation of review SEM-based observation work is desired in semiconductor wafer manufacturing lines. For the automation, a system including a review SEM includes automatic defect review (ADR) and automatic defect classification (ADC) functions. The ADR function is to perform automatic defect image collection processing to automatically collect images at intra-sample defect positions. The ADC function is to perform automatic defect image classification processing to automatically classify defects from collected defect images.

The defect coordinates of the defect position information supplied from the inspection device include an error. Accordingly, in the ADR function, the review SEM first performs imaging in a wide field of view and at a low magnification under a first imaging condition centering on the defect coordinates of the defect position information and performs defect re-detection from the resultant image (i.e. low-picture quality image). The review SEM images the defect part obtained by this re-detection in a narrow field of view and at a high magnification under a second imaging condition in the ADR function and outputs the resultant image (i.e. high-picture quality image) as an observation image. In a two-stage image observation method, a defect is searched for in a wide field of view image in the first stage and the defect is observed in detail in a high-picture quality image in the second stage as described above. The high and low of the above picture quality or the like are relative definitions, are picture qualities or the like depending on imaging conditions and, for example, mean that the magnification under the second imaging condition is higher than the magnification under the first imaging condition. The concept of picture quality (image quality) includes magnification, resolution, signal-noise ratio, and so on.

The following method is to determine and detect a defect from an image captured by the sample observation device (also referred to as inspection image). According to the method, an image obtained by capturing a region identical in circuit pattern formation to a defect part is used as a reference image and defect determination and detection are performed by comparison between the defect-free reference image and an inspection image in which a defect part is imaged. In addition, JP-A-2009-250645 (Patent Document 1) discloses a method for omitting reference image capturing by reference image composition in which an inspection image is used.

In the ADR function, it is necessary to adjust a defect detection-related processing parameter in accordance with the appearance of a semiconductor wafer pattern. The processing parameter may be automatically adjusted by searching for a processing parameter capable of detecting a defect part pre-taught by a user. In another method, a processing parameter is searched for that is capable of highly accurately discriminating a defect and a nuisance using an inspection image of a defect part and a plurality of reference images.

In addition, imaging omission by high-resolution image estimation is a method for ADR function throughput improvement. In this method, an inspection image captured in a wide field of view and a high-picture quality image captured at a high magnification are obtained first, and a model is created by learning the relationship therebetween. Then, at the time of ADR execution in this method, only the inspection image is captured and a trained model is used to estimate an observation image that is a high-picture quality image.

In semiconductor device manufacturing, successive attempts for an increase in integration density are being made for device performance improvement and manufacturing cost reduction and the dimensions of circuit patterns formed on semiconductor wafers are being reduced. Along with this, the dimensions of defects fatal to device operations also tend to decrease. Accordingly, even in the ADR functions of review SEMs, it is required to obtain a high-picture quality image as an observation image in which a minute defect can be visually recognized. Accordingly, as the related art related to, for example, the ADR function of a review SEM, there is a method for estimating and obtaining a high-picture quality observation image from a low-picture quality inspection image using machine learning.

However, the related art using this method has room for improvement in terms of accuracy. In this method, learning a model for estimating the high-picture quality observation image from the low-picture quality inspection image is performed before adjusting a processing parameter related to defect detection. In this method, an inspection image for learning and a high-picture quality image are acquired using a processing parameter of initial setting (default) before the adjustment. In this case, a defect in the inspection image may not be reflected in the high-picture quality image. Accordingly, a decline in model accuracy arises and high-accuracy estimation cannot be performed.

SUMMARY OF THE INVENTION

An object of the present invention is to provide a sample observation device-related technique with which a user can easily improve defect detection-related accuracy.

A typical embodiment of the present invention has the following configuration. A sample observation device of the embodiment includes: an imaging device; and a processor executing learning processing for learning a high-picture quality image estimation model and sample observation processing for performing defect detection, in which (A) in the learning processing: (A1) one or more learning defect positions related to a learning sample are acquired; (A2) a low-picture quality learning image under a first imaging condition is acquired for each of the learning defect positions; (A3) a first set value related to an imaging count of a high-picture quality learning image is acquired; (A4) for each of the learning defect positions; (A4a) the imaging count of the high-picture quality learning image is determined based on the first set value; (A4b) one or more imaging points as positions where the high-picture quality learning image is captured are determined based on the imaging count determined in (A4a); (A4c) the high-picture quality learning image under a second imaging condition is acquired for each of the one or more imaging points determined in (A4b); (A5) the high-picture quality image estimation model is learned using the low-picture quality learning image and the high-picture quality learning image; and (A6) a defect detection parameter is adjusted using the high-picture quality image estimation model, and (B) in the sample observation processing, based on the adjusted defect detection parameter: (B1) a first inspection image of a defect position of an observation target sample is acquired under the first imaging condition; and (B2) a defect candidate of the observation target sample is detected based on the first inspection image.

Provided according to the typical embodiment of the present invention is a sample observation device-related technique with which a user can easily improve defect detection-related accuracy. Tasks, configurations, effects, and so on other than those described above are shown in the forms for carrying out the invention.

BRIEF DESCRIPTION OF THE DRAWINGS

FIG. 29 is a flowchart of parameter adjustment step S2504 in the third embodiment.

DESCRIPTION OF EMBODIMENTS

Figure 1:
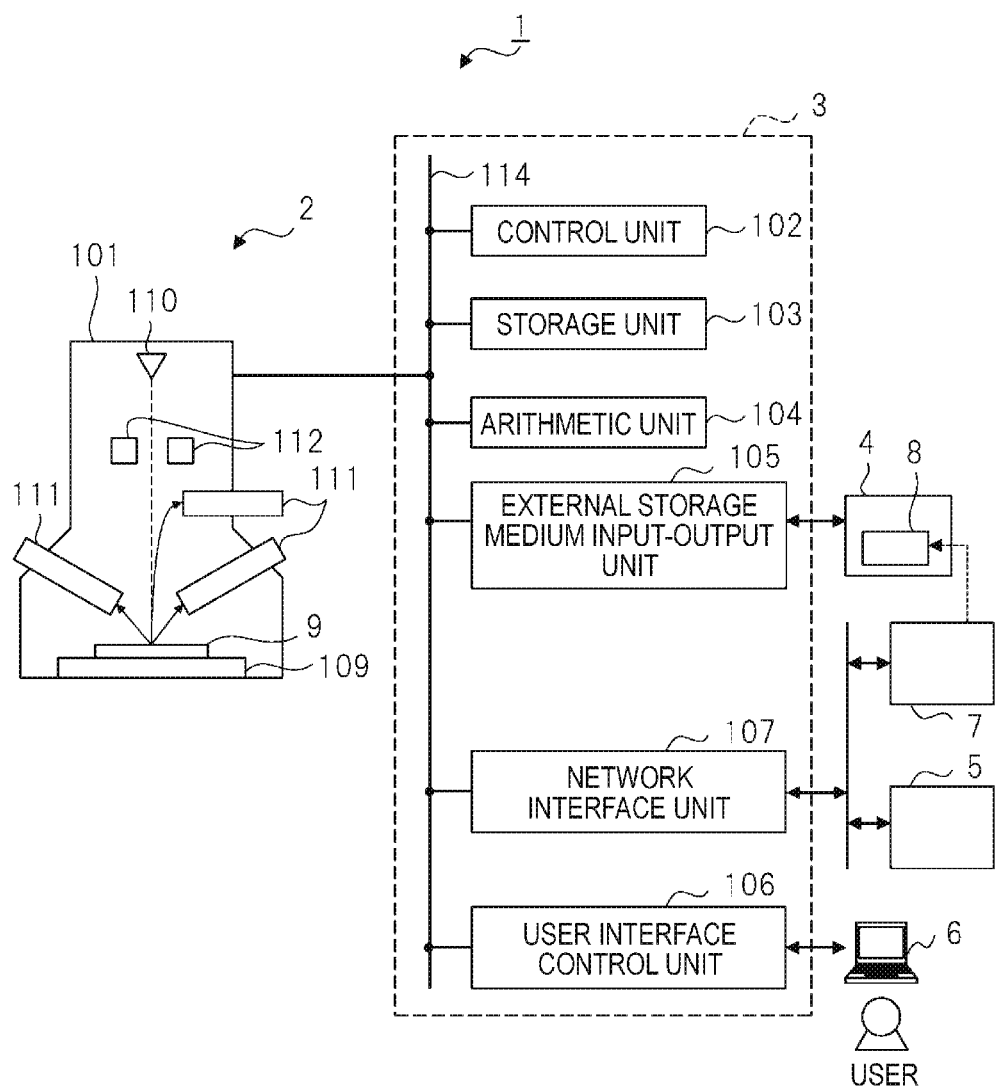
FIG. 1 is a diagram illustrating the configuration of a sample observation device of a first embodiment of the present invention.

Hereinafter, embodiments of the present invention will be described in detail with reference to the drawings. In the drawings, the same parts are designated by the same reference numerals in principle, and repeated description thereof will be omitted. In the drawings, the representation of each component may not represent the actual position, size, shape, range, and so on to facilitate understanding of the invention. In the description, in describing processing by a program, the program, a function, a processing unit, and so on may be mainly described, but the main hardware therefor is a processor or a controller, a device, a computer, a system, or the like configured by the processor or the like. The computer executes processing in accordance with a program read out on a memory with the processor while appropriately using resources such as the memory and a communication interface. As a result, a predetermined function, processing unit, and so on are realized. The processor is configured by, for example, a semiconductor device such as a CPU and a GPU. The processor is configured by a device or circuit capable of performing a predetermined operation. The processing can also be implemented by a dedicated circuit without being limited to software program processing.

FPGA, ASIC, CPLD, and so on can be applied to the dedicated circuit. The program may be pre-installed as data in the target computer or may be installed after being distributed as data from a program source to the target computer. The program source may be a program distribution server on a communication network, a non-transient computer-readable storage medium (e.g. memory card), or the like. The program may be configured by a plurality of modules. A computer system may be configured by a plurality of devices without being limited to a single device. The computer system may be configured by a client server system, a cloud computing system, an IoT system, or the like. Various data and information are configured in a structure such as a table and a list, but the present invention is not limited thereto. Representations such as identification information, identifiers, IDs, names, and numbers are mutually replaceable.

Embodiments

The sample observation device of the embodiments is a device for observing a circuit pattern or a defect formed on a sample such as a semiconductor wafer. The sample observation device includes an inspection image acquisition unit acquiring an inspection image (i.e. low-picture quality image) under a first imaging condition for each defect position in defect position information created and output by an inspection device, a high-picture quality image acquisition unit acquiring a plurality of high-picture quality images under a second imaging condition for each defect position, a defect detection unit calculating the position and feature quantity of a defect candidate using the inspection image, a model learning unit learning a model (high-picture quality image estimation model) for estimating the image acquired under the second imaging condition from the image acquired under the first imaging condition using the inspection image and the high-picture quality image, and a parameter adjustment unit adjusting a parameter related to the defect detection processing of the defect detection unit using the model.

The sample observation method of the embodiments is a method including steps executed in the sample observation device of the embodiments and includes steps associated with the above parts. The processing in the sample observation device and the corresponding steps are roughly divided into sample observation processing (i.e. defect detection processing and so on) and learning processing. The learning processing is to perform model learning by machine learning in association with an image used in the sample observation processing and adjust a parameter related to the sample observation processing.

Hereinafter, a device for observing, for example, a semiconductor wafer defect using a semiconductor wafer as a sample will be described as an example of the sample observation device. This sample observation device includes an imaging device that images a sample based on defect coordinates in defect position information from a defect inspection device. An example of using a SEM as the imaging device will be described below. The imaging device is not limited to a SEM and may be a non-SEM device such as an imaging device using charged particles such as ions.

First Embodiment

The sample observation device and so on of a first embodiment will be described with reference to FIGS. 1 to 20. In the sample observation device of a comparative example, a high-picture quality image for learning a high-picture quality image estimation model is collected before adjusting a processing parameter related to ADR processing for sample defect observation. In this configuration, a defect may not appear in the high-picture quality image. In that case, the accuracy of the model declines. In this regard, the sample observation device of the first embodiment (e.g. FIG. 2) includes a high-picture quality image acquisition unit 206. The high-picture quality image acquisition unit 206 has an imaging count determination unit 207 determining the count of high-picture quality image capturing, an imaging point determination unit 208 determining a plurality of imaging points of a high-picture quality image based on the position and feature quantity of a defect candidate calculated by a defect detection unit 215 and the imaging count, and a high-picture quality image capturing unit 209 capturing a high-picture quality image under the second imaging condition for each of the plurality of determined imaging points. As a result, the accuracy of the model can be improved, and the accuracy of sample defect observation can be improved by adjusting a parameter using the model.

The defect detection processing of the ADR function in the first embodiment (step S707 in FIG. 7 to be described later) is realized using general image processing (i.e. difference determination by comparison between inspection and reference images or the like). In the first embodiment, machine learning (step S703) is used in order to adjust a parameter for the defect detection processing (step S704). As described above, in a two-stage image, the high-low relationship of, for example, picture quality is a relative definition. In addition, an imaging condition defining the picture quality (i.e. picture quality condition) or the like is a condition applied to the case of creating an image by processing as well as the case of actually capturing an image with an imaging device.

[1-1. Sample Observation Device]

FIG. 1 illustrates the configuration of a sample observation device 1 of the first embodiment. The sample observation device 1 is roughly divided into and configured to have an imaging device 2 and a higher control device 3. The sample observation device 1 is a review SEM as a specific example. The imaging device 2 is a SEM 101 as a specific example. The higher control device 3 is coupled to the imaging device 2. The higher control device 3 is a device that controls, for example, the imaging device 2. In other words, the higher control device 3 is a computer system. Although the sample observation device 1 and so on are provided with necessary functional blocks and various devices, some thereof including an essential element are illustrated in the drawing. The whole including the sample observation device 1 of FIG. 1 is configured as a defect inspection system in other words. A storage medium device 4 and an input-output terminal 6 are connected to the higher control device 3. A defect classification device 5, an inspection device 7, and so on are connected to the higher control device 3 via a network.

The sample observation device 1 is a device or system that has an automatic defect review (ADR) function. In this example, defect position information 8 is created as a result of pre-inspecting a sample at the external inspection device 7. The defect position information 8 output and provided from the inspection device 7 is pre-stored in the storage medium device 4. The higher control device 3 reads out the defect position information 8 from the storage medium device 4 and refers to the defect position information 8 during defect observation-related ADR processing. The SEM 101 that is the imaging device 2 captures an image of a semiconductor wafer that is a sample 9. The sample observation device 1 performs ADR processing based on the image captured by the imaging device 2 to obtain a plurality of high-picture quality inspection images.

The defect classification device 5 (i.e. defect image classification device) is a device or system that has an automatic defect classification (ADC) function. The defect classification device 5 performs ADC processing based on information or data that is the result of the defect observation processing by the sample observation device 1 using the ADR function and obtains a result in which defects (corresponding defect images) are classified. The defect classification device 5 supplies the information or data that is the classification result to, for example, another network-connected device (not illustrated). The present invention is not limited to the configuration illustrated in FIG. 1. Also possible is, for example, a configuration in which the defect classification device 5 is merged with the sample observation device 1.

The higher control device 3 includes, for example, a control unit 102, a storage unit 103, an arithmetic unit 104, an external storage medium input-output unit 105 (i.e. input-output interface unit), a user interface control unit 106, and a network interface unit 107. These components are connected to a bus 114 and are capable of mutual communication, input, and output. Although the example of FIG. 1 illustrates a case where the higher control device 3 is configured by one computer system, the higher control device 3 may be configured by, for example, a plurality of computer systems (e.g. plurality of server devices).

The control unit 102 corresponds to a controller that controls the entire sample observation device 1. The storage unit 103 stores various information and data including a program and is configured by a storage medium device including, for example, a magnetic disk, a semiconductor memory, or the like. The arithmetic unit 104 performs an operation in accordance with a program read out of the storage unit 103. The control unit 102 and the arithmetic unit 104 include a processor and a memory. The external storage medium input-output unit (i.e. input-output interface unit) 105 performs data input and output in relation to the external storage medium device 4.

The user interface control unit 106 is a part that provides and controls a user interface including a graphical user interface (GUI) for performing information and data input and output in relation to a user (i.e. operator). The input-output terminal 6 is connected to the user interface control unit 106. Another input or output device (e.g. display device) may be connected to the user interface control unit 106. The defect classification device 5, the inspection device 7, and so on are connected to the network interface unit 107 via a network (e.g. LAN). The network interface unit 107 is a part that has a communication interface controlling communication with an external device such as the defect classification device 5 via a network. A DB server, a manufacturing execution system (MES), or the like is another example of the external device.

A user inputs information (e.g. instruction or setting) to the sample observation device 1 (particularly, higher control device 3) using the input-output terminal 6 and confirms information output from the sample observation device 1. A PC or the like can be applied to the input-output terminal 6, and the input-output terminal 6 includes, for example, a keyboard, a mouse, and a display. The input-output terminal 6 may be a network-connected client computer. The user interface control unit 106 creates a GUI screen (described later) and displays the screen on the display device of the input-output terminal 6.

The arithmetic unit 104 is configured by, for example, a CPU, a ROM, and a RAM and operates in accordance with a program read out of the storage unit 103. The control unit 102 is configured by, for example, a hardware circuit or a CPU. In a case where the control unit 102 is configured by a CPU or the like, the control unit 102 also operates in accordance with the program read out of the storage unit 103. The control unit 102 realizes each function (each functional block to be described later) based on, for example, program processing. Data such as a program is stored in the storage unit 103 after being supplied from the storage medium device 4 via the external storage medium input-output unit 105. Alternatively, data such as a program may be stored in the storage unit 103 after being supplied from a network via the network interface unit 107.

The SEM 101 of the imaging device 2 includes, for example, a stage 109, an electron source 110, a detector 111, an electron lens (not illustrated), and a deflector 112. The stage 109 (i.e. sample table) is a stage on which the semiconductor wafer that is the sample 9 is placed, and the stage is movable at least horizontally. The electron source 110 is an electron source for irradiating the sample with an electron beam. The electron lens (not illustrated) converges the electron beam on the sample 9 surface. The deflector 112 is a deflector for performing electron beam scanning on the sample 9. The detector 111 detects electrons and particles such as secondary and backscattered electrons generated from the sample 9. In other words, the detector 111 detects the state of the sample 9 surface as an image. In this example, a plurality of detectors (described later) are provided as the detector 111 as illustrated in the drawing.

The information (i.e. image signal) detected by the detector 111 of the SEM 101 is supplied to the bus 114 of the higher control device 3. The information is processed by, for example, the arithmetic unit 104. In this example, the higher control device 3 controls the stage 109 of the SEM 101, the deflector 112, the detector 111, and so on. A drive circuit or the like for driving, for example, the stage 109 is not illustrated. Defect observation processing is realized with respect to the sample 9 by the computer system that is the higher control device 3 processing the information (i.e. image) from the SEM 101.

This system may have the following form. The higher control device 3 is a server such as a cloud computing system, and the input-output terminal 6 operated by a user is a client computer. For example, in a case where a lot of computer resources are required for machine learning, machine learning processing may be performed in a server group such as a cloud computing system. A processing function may be shared between the server group and the client computer. The user operates the client computer, and the client computer transmits a request to the server. The server receives the request and performs processing in accordance with the request. For example, the server transmits data on a requested screen (e.g. web page) to the client computer as a response. The client computer receives the response data and displays the screen (e.g. web page) on the display screen of a display device.

[1-2. Functional Blocks]

Figure 2:
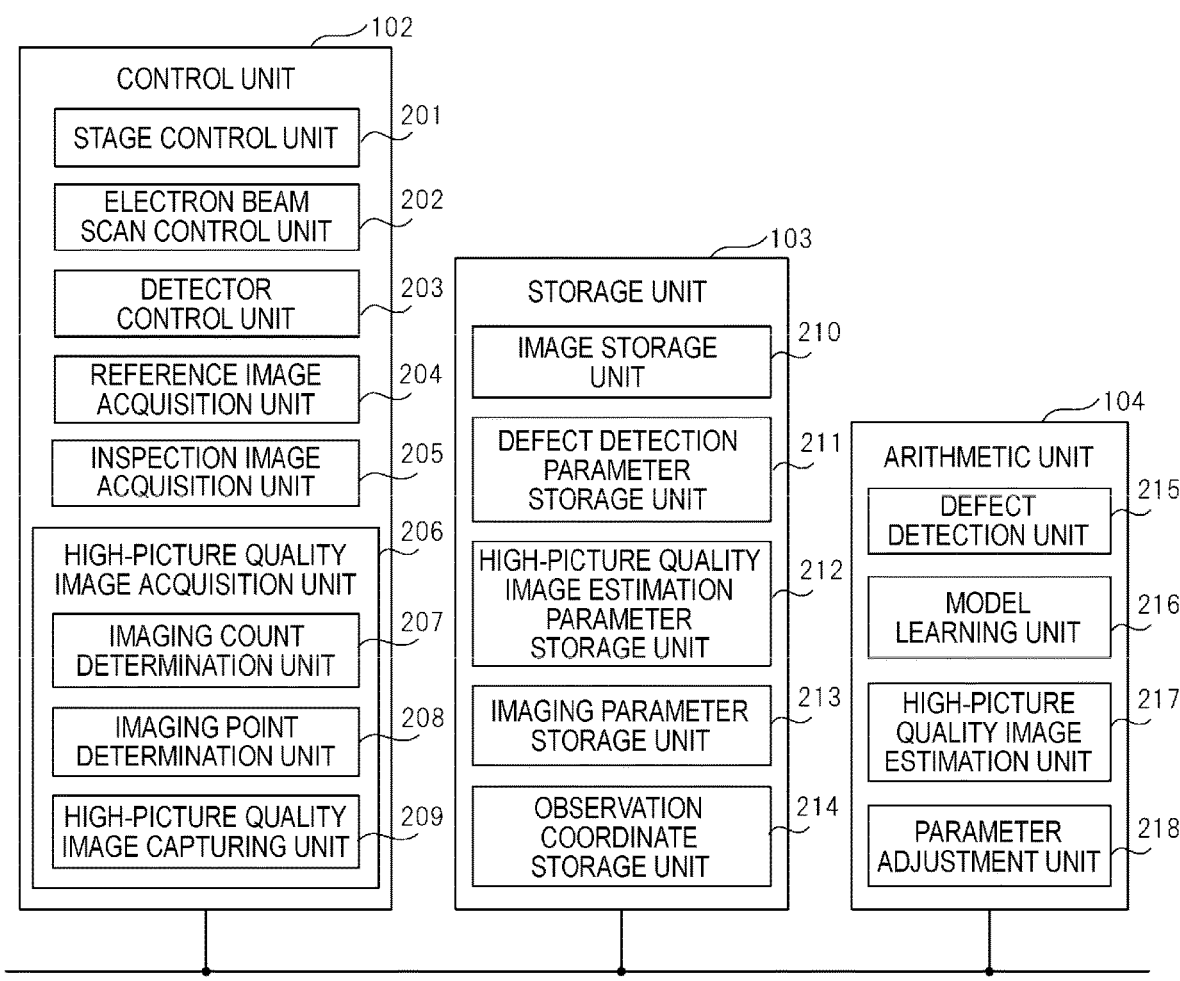
FIG. 2 is a diagram illustrating the functional block configuration of a higher control device in the first embodiment.

FIG. 2 illustrates a functional block configuration example realized by the control unit 102, the storage unit 103, and the arithmetic unit 104 of the higher control device 3 of FIG. 1 in the first embodiment. The control unit 102 and the arithmetic unit 104 are configured with each functional block as in FIG. 2 based on program processing, and the storage unit 103 is configured with each storage unit as in FIG. 2. The control unit 102 includes a stage control unit 201, an electron beam scan control unit 202, a detector control unit 203, a reference image acquisition unit 204, an inspection image acquisition unit 205, and the high-picture quality image acquisition unit 206. The high-picture quality image acquisition unit 206 includes the imaging count determination unit 207, the imaging point determination unit 208, and the high-picture quality image capturing unit 209. The arithmetic unit 104 includes the defect detection unit 215, a model learning unit 216, a high-picture quality image estimation unit 217, and a parameter adjustment unit 218.

The stage control unit 201 controls the movement and stop of the stage 109 in FIG. 1. The electron beam scan control unit 202 controls, for example, a polarizer 112 in FIG. 1 such that an electron beam is emitted in a predetermined field of view. The detector control unit 203 samples a signal from the detector 111 of FIG. 1 in synchronization with electron beam scan, adjusts, for example, the gain or offset of the sampled signal, and generates a digital image.

The reference image acquisition unit 204 acquires a defect-free reference image for use in defect observation processing by imaging under the first imaging condition by operating the stage control unit 201, the electron beam scan control unit 202, and the detector control unit 203. The inspection image acquisition unit 205 acquires an inspection image for use in defect observation processing by imaging under the first imaging condition by operating the stage control unit 201, the electron beam scan control unit 202, and the detector control unit 203.

The high-picture quality image acquisition unit 206 acquires a plurality of high-picture quality images associated with the inspection image acquired by the inspection image acquisition unit 205 by imaging under the second imaging condition. The high-picture quality image is an image for defect observation and is required to have high visibility of a defect or circuit pattern on the surface of the sample 9. Accordingly, this high-picture quality image is to be higher in picture quality than an inspection image and, in general, the second imaging condition is a condition allowing an image of higher picture quality to be captured as compared with the first imaging condition. For example, the second imaging condition is lower in electron beam scanning speed, larger in additional image frame count, and higher in image resolution than the first imaging condition. The imaging conditions are not limited thereto.

The storage unit 103 includes an image storage unit 210, a defect detection parameter storage unit 211, a high-picture quality image estimation parameter storage unit 212, an imaging parameter storage unit 213, and an observation coordinate storage unit 214. The image storage unit 210 stores a digital image generated by the detector control unit 203 (i.e. image captured by SEM 101) together with incidental information (i.e. attribute information, metadata, management information, or the like) and stores an image generated by the arithmetic unit 104.

The defect detection parameter storage unit 211 stores a parameter related to the defect detection processing necessary for defect observation (referred to as defect detection parameter in some cases). The high-picture quality image estimation parameter storage unit 212 stores a parameter related to a high-picture quality image estimation model (referred to as model parameter in some cases). The imaging parameter storage unit 213 stores information and data such as conditions in performing imaging in the SEM 101 (also referred to as imaging conditions) as imaging parameters. The imaging conditions include the first imaging condition and the second imaging condition described above and can be set in advance. Examples of the imaging parameter include electron beam scanning speed, additional image frame count, and image resolution. The observation coordinate storage unit 214 stores information and data such as the defect coordinates of a defect position of an observation target input based on the defect position information 8 (also referred to as observation coordinates).

The defect detection unit 215 calculates the position and feature quantity of a defect candidate in an inspection image. The model learning unit 216 performs the processing of learning a model necessary for performing the estimation processing of estimating an image acquired under the second imaging condition from an image acquired under the first imaging condition (also referred to as high-picture quality image estimation model). The estimation in the model means creating and outputting by estimation a high-picture quality image that is not an actually captured image. The image used in learning the model is different from an image used in actual defect observation using a trained model.

The high-picture quality image estimation unit 217 uses the model to perform estimation processing from the first image acquired under the first imaging condition to the second image acquired under the second imaging condition. The high-picture quality image estimation unit 217 inputs the first image to the model and obtains the second image as the output of the estimation result.

The parameter adjustment unit 218 is a part that realizes the parameter adjustment function of automatically adjusting a defect observation-related processing parameter (i.e. recipe or the like). This processing parameter includes a defect detection parameter, a model parameter, and an imaging parameter. Examples of the defect detection parameter include a threshold for defect determination. The model parameter is a parameter configuring (i.e. setting) a high-picture quality image estimation model. The model parameter is, for example, a parameter configuring the CNN to be described later or the like.

[1-3. Detector]

Figure 3:
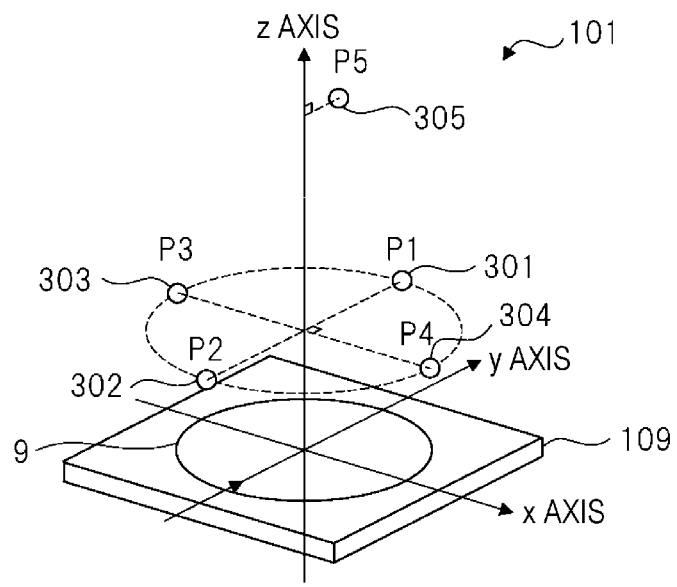
FIG. 3 is a diagram in which the disposition of detectors of a SEM is viewed from diagonally above in the first embodiment.
Figure 4:
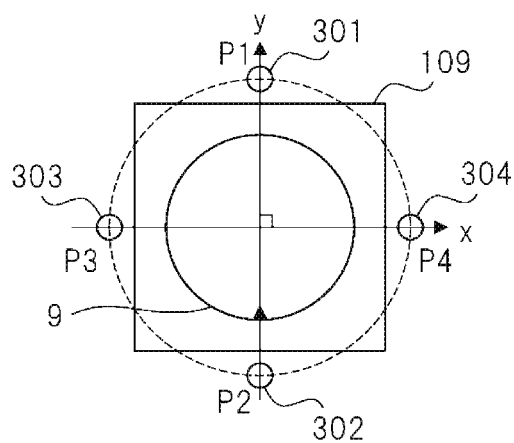
FIG. 4 is a diagram in which the disposition of the detectors of the SEM is viewed from the z-axis direction in the first embodiment.
Figure 5:
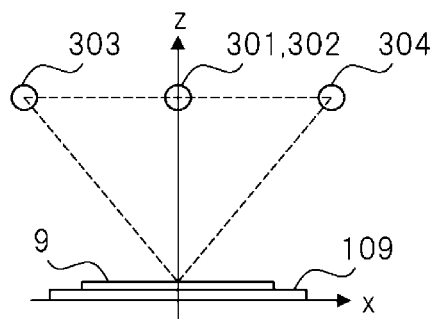
FIG. 5 is a diagram in which the disposition of the detectors of the SEM is viewed from the y-axis direction in the first embodiment.

FIG. 3 is a projection drawing in which the disposition of the detector 111 with respect to the stage 109 in the SEM 101 is viewed from diagonally above in the first embodiment. In this example, five detectors 301 to 305 are provided as the detectors 111. These detectors 301 to 305 are mounted at predetermined positions in the SEM 101 as illustrated in the drawing. The detectors 111 are not limited thereto in number. FIG. 4 is a plan view in which the disposition of the detector 111 is viewed from the z-axis direction. The z axis corresponds to the vertical direction. FIG. 5 is a cross-sectional view in which the disposition of the detector 111 is viewed from the y-axis direction. The x axis and y axis correspond to the horizontal direction and are two orthogonal directions.

As illustrated in FIGS. 3 to 5, the detector 301 and the detector 302 are disposed at positions P1 and P2 along the y axis and the detector 303 and the detector 304 are disposed at positions P3 and P4 along the x axis. These detectors 301 to 304, which are not particularly limited, are disposed in the same plane on the z axis. The detector 305 is disposed along the z axis at a position P5, which is away from the sample 9 on the stage 109 as compared with the position of the plane on the z-axis where the detectors 301 to 304 are disposed. The detector 305 is omitted in FIGS. 4 and 5.

The detectors 301 to 304 are disposed so as to be capable of selectively detecting electrons that have specific emission angles (elevation and azimuth angles). The detector 301 is capable of detecting electrons emitted from the sample 9 along the y-axis direction (positive direction indicated by an arrow). The detector 302 is capable of detecting electrons emitted from the sample 9 along the y-axis direction (direction of inversion with respect to the positive direction). Likewise, the detector 304 is capable of detecting electrons emitted along the x-axis direction (positive direction), and the detector 303 is capable of detecting electrons emitted along the inversion direction of the x axis. As a result, it is possible to acquire an image with contrast as if light was emitted from a facing direction with respect to each detector. The detector 305 is capable of detecting mainly electrons emitted from the sample 9 in the z-axis direction.

As described above, with the configuration in the first embodiment in which the plurality of detectors are disposed at the plurality of positions along the different axes, it is possible to acquire an image with contrast, and thus more detailed defect observation is possible. The configuration of the detector 111 is not limited thereto and, in an alternative configuration, the detector 111 may be disposed at a position or orientation different from that of FIG. 3.

[1-4. Defect Position Information]

Figure 6:
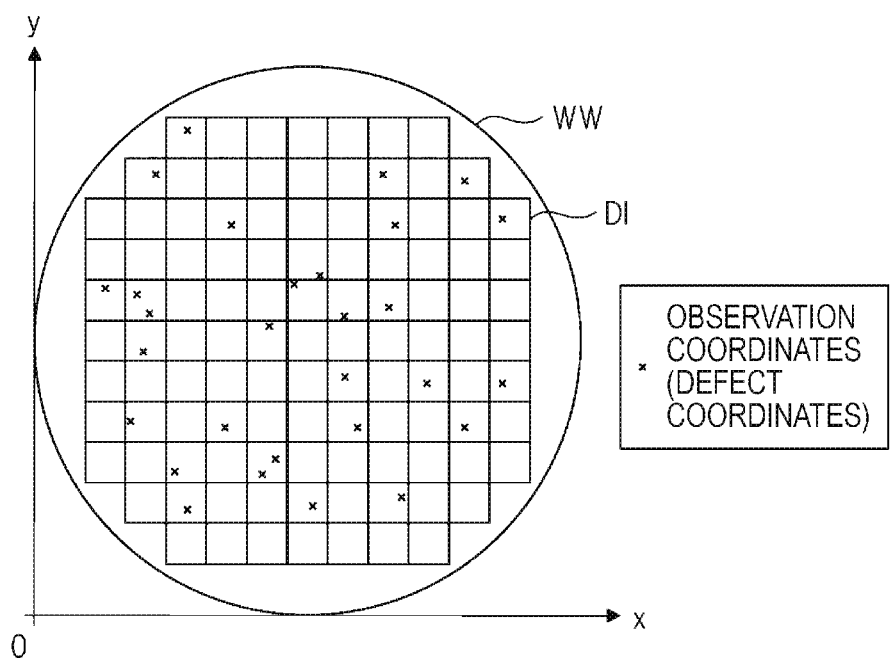
FIG. 6 is an explanatory diagram schematically illustrating an example of defect coordinates on a semiconductor wafer surface indicated by defect position information of an inspection device.

FIG. 6 is a schematic diagram illustrating an example of a defect position indicated by defect coordinates in the defect position information 8 from the external inspection device 7. In FIG. 6, the defect coordinates are illustrated by points (x marks) on the x-y plane of the target sample 9. When viewed from the sample observation device 1, the defect coordinates are observation coordinates to be observed. A wafer WW indicates a circular semiconductor wafer surface region. Dies DI indicate the regions of the plurality of dies (i.e. semiconductor chips) formed on the wafer WW.

The sample observation device 1 of the first embodiment has an ADR function to automatically collect a high-definition image of a defect part of the surface of the sample 9 as a high-picture quality image based on such defect coordinates. However, the defect coordinates in the defect position information 8 from the inspection device 7 include an error. In other words, an error may occur between the defect coordinates in the coordinate system of the inspection device 7 and the defect coordinates in the coordinate system of the sample observation device 1. Examples of the cause of the error include imperfect alignment of the sample 9 on the stage 109.

Accordingly, the sample observation device 1 of the first embodiment first captures a low-magnification image with a wide field of view (i.e. image of relatively low picture quality) as an inspection image under the first imaging condition centering on the defect coordinates of the defect position information 8 and re-detects the defect part based on the inspection image. Then, the sample observation device 1 estimates a high-magnification high-picture quality image with a narrow field of view under the second imaging condition regarding the re-detected defect part using the pre-trained high-picture quality image estimation model and acquires the high-picture quality image as an observation image.

The wafer WW includes the plurality of regular dies DI. Accordingly, in a case where, for example, another die DI adjacent to the die DI that has a defect part is imaged, it is possible to acquire an image of a non-defective die that includes no defect part. In the defect detection processing in the sample observation device 1, for example, such a non-defective die image can be used as a reference image. Further, in the defect detection processing, for example, shading (example of feature quantity) comparison as a defect determination is performed between the reference and inspection images and a part different in shading can be detected as a defect part. A threshold that determines the difference in shading in determining the defect part in this manner is an example of the defect detection parameter described above.

[1-5. Defect Observation Method]

Next, the defect observation method in the sample observation device 1 will be described. First, the defect observation method and processing as a whole will be described, and each step performed in the defect observation method will be described in detail in order. The main agent of the execution of the steps is mainly the higher control device 3 (processor in particular), and the control unit 102, the storage unit 103, the arithmetic unit 104, and so on in FIG. 2 are used as appropriate. The information required in the steps is read from the storage unit 103, and the information generated in the steps is stored in the storage unit 103. The learning sample that is the target during the learning processing (steps S702 to S707 in FIG. 7 to be described later) and the observation target sample that is the target during the sample observation processing (steps S705 to S708 to be described later) may be different samples and the target positions may be different positions of the same sample.

[1-6. Overall Processing]

Figure 7:
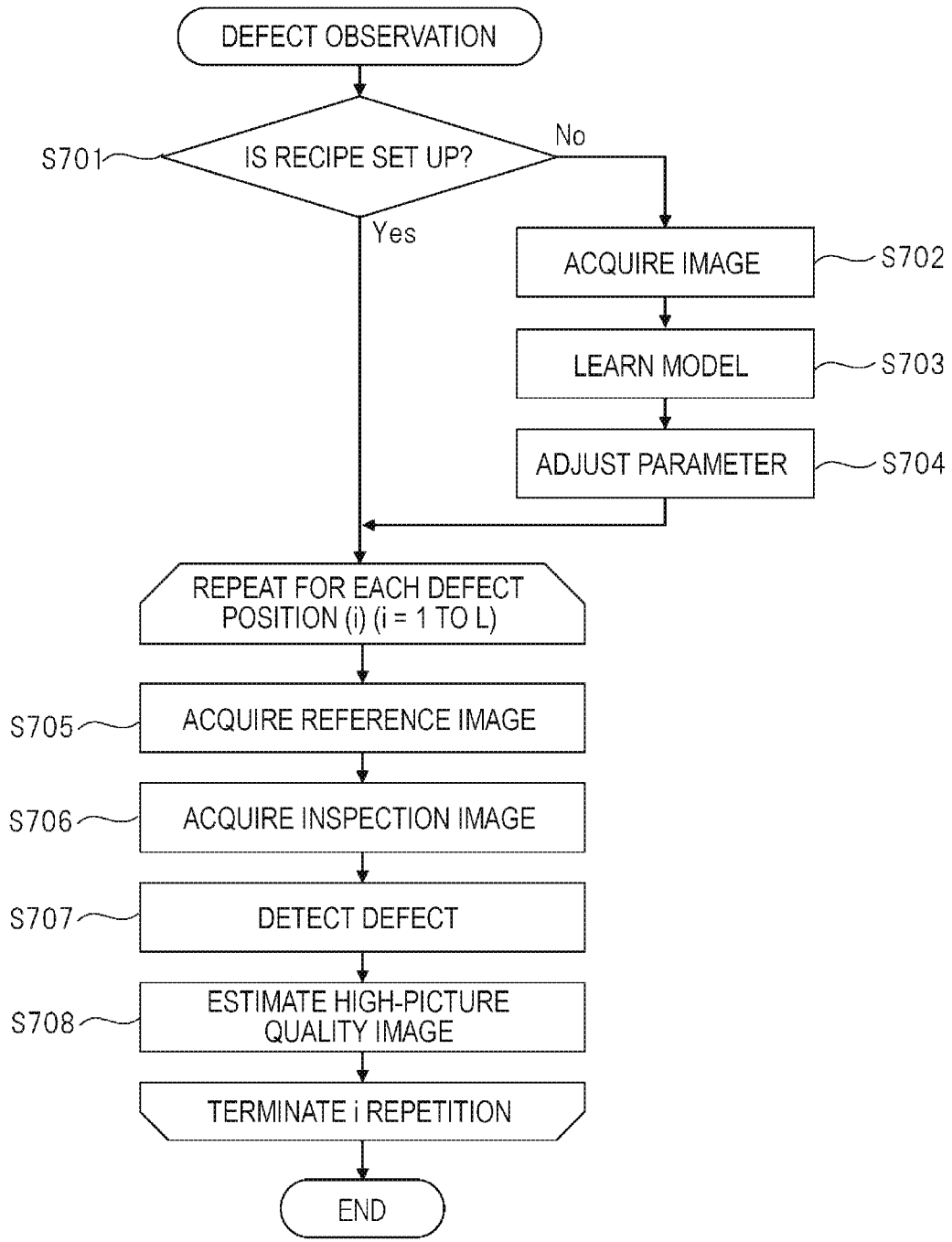
FIG. 7 is a flowchart illustrating the entire processing of the sample observation device of the first embodiment.

FIG. 7 illustrates a defect observation processing flow as the processing and operation of the sample observation device 1 as a whole in the first embodiment. FIG. 7 includes steps S701 to S708. At the start of the defect observation, in step S701, the higher control device 3 reads information such as parameters from, for example, the defect detection parameter storage unit 211, the high-picture quality image estimation parameter storage unit 212, and the imaging parameter storage unit 213 in FIG. 2 and determines whether a recipe related to the defect observation and defect detection processing is set up. The recipe is a set of information necessary for performing the defect observation and defect detection processing and includes, for example, an ADR function-related processing parameter. The processing proceeds to step S702 in a case where the recipe is not yet to be set up (No). The processing proceeds to step S705 in a case where the recipe is set up (Yes). Steps S702 to S704 are processing for recipe setup (learning processing described above). Steps S705 to S708 are the processing of actual sample observation and defect detection.

Step S702 is an image acquisition step. In step S702, the higher control device 3 uses the reference image acquisition unit 204, the inspection image acquisition unit 205, and the high-picture quality image acquisition unit 206 in FIG. 2 to learn a high-picture quality image estimation model (step S703) and acquires images (low- and high-picture quality learning images) used for defect detection parameter adjustment (step S704). At this time, the higher control device 3 reads the defect coordinates of the wafer WW as in FIG. 6 as an image acquisition target from the observation coordinate storage unit 214, acquires an image corresponding to the entire defect coordinates, and stores the acquired image in the image storage unit 210.

The model learning step of step S703 is performed next. In step S703, the higher control device 3 reads the image acquired in step S702 from the image storage unit 210 and uses the model learning unit 216 to execute learning of the high-picture quality image estimation model related to the processing of the high-picture quality image estimation unit 217. The trained model is stored in the high-picture quality image estimation parameter storage unit 212.

The parameter adjustment step of step S704 is performed next. In step S704, the higher control device 3 adjusts a defect detection parameter using the parameter adjustment unit 218. The adjusted defect detection parameter is stored in the defect detection parameter storage unit 211.

In a case where the recipe is set up before the defect observation or after setup by steps S702 to S704, the loop processing of steps S705 to S708 is executed. In this loop processing, the processing of steps S705 to S708 is repeated for each defect position indicated by the defect coordinates in the observation target sample. The defect position corresponding to the defect coordinates is i, which is 1 to L.

Step S705 is a reference image acquisition step. In step S705, the higher control device 3 uses the reference image acquisition unit 204 to image the die DI adjacent to the die DI including a defect position (i) under the first imaging condition stored in the imaging parameter storage unit 213. As a result, the higher control device 3 acquires a reference image (first reference image) corresponding to an inspection image (first inspection image).

Step S706 is an inspection image acquisition step. In step S706, the higher control device 3 uses the inspection image acquisition unit 205 to acquire the inspection image (first inspection image) at the defect position (i) by performing imaging under the first imaging condition stored in the imaging parameter storage unit 213. The reference and inspection images acquired in these steps are stored in the image storage unit 210 in association with each other.

Step S707 is a defect detection step. In step S707, the higher control device 3 performs defect detection from the inspection image using the reference image obtained in step S705, the inspection image obtained in step S706, and the set-up (i.e. adjusted) defect detection parameter stored in the defect detection parameter storage unit 211 in the defect detection unit 215. The defect detection parameter is, for example, an image mixing ratio in the mixing processing to be described later.

Step S708 is a high-picture quality image estimation step. In step S708, the higher control device 3 performs high-picture quality image estimation using the defect position information of the defect detection result in the inspection image obtained in step S707 and the high-picture quality image estimation unit 217. In other words, the higher control device 3 estimates and obtains a high-picture quality image for defect observation from an inspection image based on a model. The estimated high-picture quality image is stored in the image storage unit 210 in association similarly to the inspection image and the reference image. In this estimation in step S708, the high-picture quality image estimation model set up or set up in step S703 may be used. In addition, in the sample observation processing, high-accuracy defect detection, defect observation, analysis, measurement, evaluation, or the like may be performed using the high-picture quality image obtained in step S708. This defect observation flow ends when the processing of steps S705 to S708 is performed at every defect position (i).

[1-7. Step S707 Defect Detection]

Figure 8:
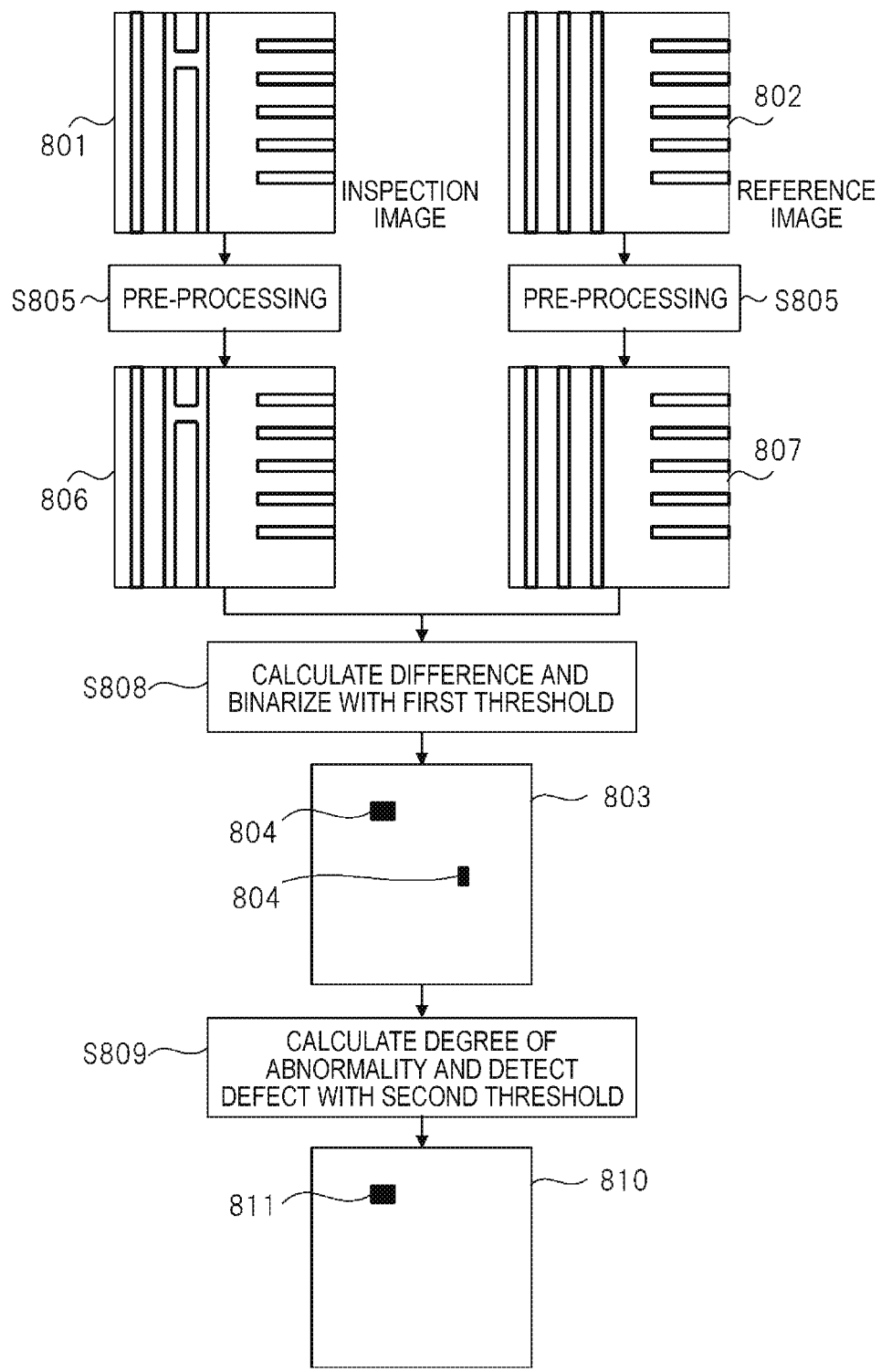
FIG. 8 is an explanatory diagram related to defect detection step S707 in the first embodiment.

FIG. 8 is an explanatory diagram related to the defect detection processing in step S707. In step S707, the defect detection unit 215 performs smoothing processing and mixing processing of the image acquired by the detector 111 (301 to 305) as pre-processing of step S805 for each of an inspection image 801 and a reference image 802. Subsequently, in step S808, the defect detection unit 215 calculates the difference between a pre-processed inspection image 806 and a pre-processed reference image 807 and binarizes the difference using a first threshold to obtain a binarized image 803.

In step S809, the defect detection unit 215 calculates the degree of abnormality for each region 804 determined to be larger than the first threshold in the binarized image 803. The defect detection unit 215 detects a part where the degree of abnormality is larger than a second threshold as a defect 811 and obtains a binarized image 810 (i.e. defect detection result image). As the degree of abnormality, for example, the sum of the brightness values of the difference images in the binarized region can be used. In the processing of FIG. 8, examples of the defect detection parameters include the degree of smoothing at the time of the smoothing processing during the pre-processing, the image mixing ratio at the time of the mixing processing, the first threshold, and the second threshold. Although the example of FIG. 8 illustrates a case where one defect 811 is detected as the binarized image 810 of the defect detection result, no defect may be detected or a plurality of defects may be detected in another case.

[1-8. Step S702 Image Acquisition]

Figure 9:
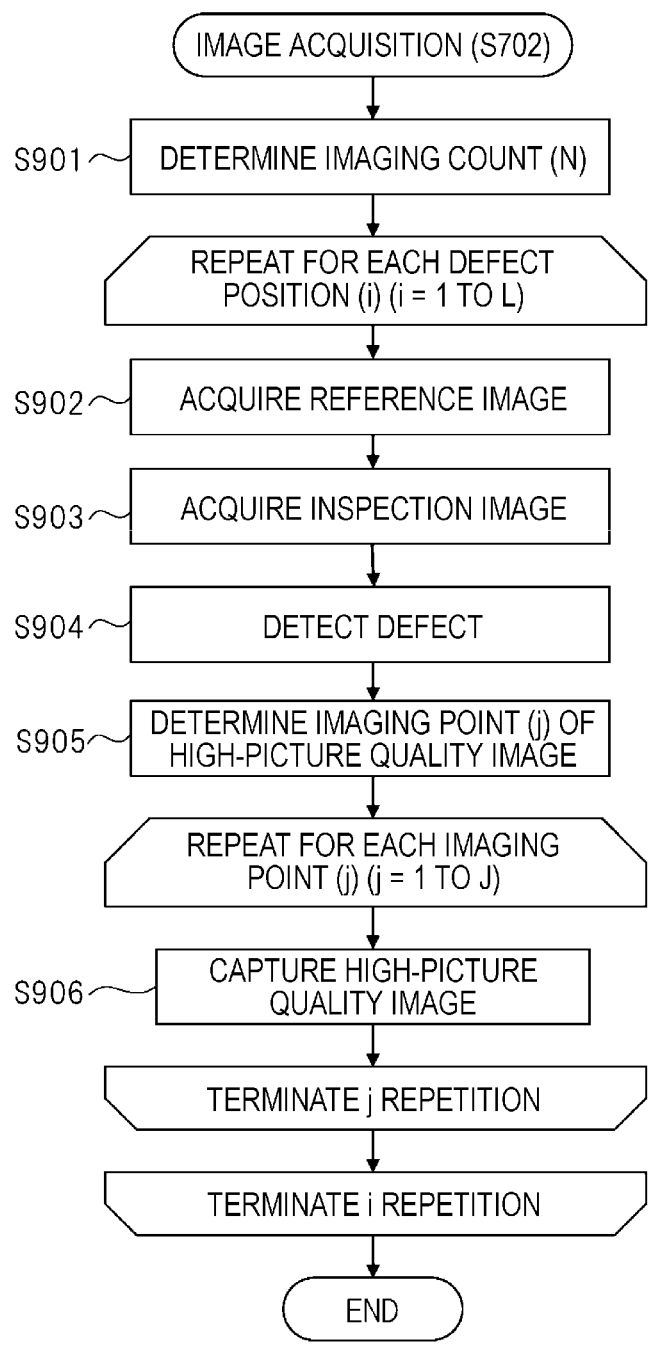
FIG. 9 is a flowchart of image acquisition step S702 in the first embodiment.

FIG. 9 illustrates a detailed flow related to the image acquisition processing of step S702. In the sample observation device 1 of the first embodiment, an inspection image including a defect part, a reference image including no defect, and a plurality of high-picture quality images are required for each defect position (i) for defect observation. Accordingly, in this step S702, the higher control device 3 uses the inspection image acquisition unit 205, the reference image acquisition unit 204, and the high-picture quality image acquisition unit 206 to acquire those images (i.e. low-picture quality learning image, learning reference image, and high-picture quality learning image).

The high-picture quality image is acquired by performing imaging under the second imaging condition stored in the imaging parameter storage unit 213 with regard to the defect position (corresponding defect candidate) detected by performing defect detection on the inspection image. However, the defect detection parameter is a default parameter not adjusted to the target process (semiconductor wafer manufacturing process). In a case where only one of the defect candidates detected by performing defect detection using the default parameter (e.g. candidate with maximum degree of abnormality) is imaged, no defect may appear in the high-picture quality image. Accordingly, in the first embodiment, a high-picture quality image is acquired while changing the imaging region for each defect candidate detected from the inspection image. This results in an increase in the probability of acquiring a high-picture quality image in which a defect is reflected. In a case where a plurality of defect candidates are detected from one inspection image, the sample observation device 1 of the first embodiment captures a high-picture quality image corresponding to each defect candidate.

The flow of FIG. 9 includes steps S901 to S906. First, in step S901, the higher control device 3 determines an imaging count (referred to as N) using the imaging count determination unit 207. This imaging count (N) is the maximum number of high-picture quality image (high-picture quality learning image) capturing. In the first embodiment, the maximum number of high-picture quality image capturing is the number of defect candidates to be imaged. In step S901, the processor determines the imaging count (N) associated with one inspection image by user input (i.e. setting).

Figure 10:
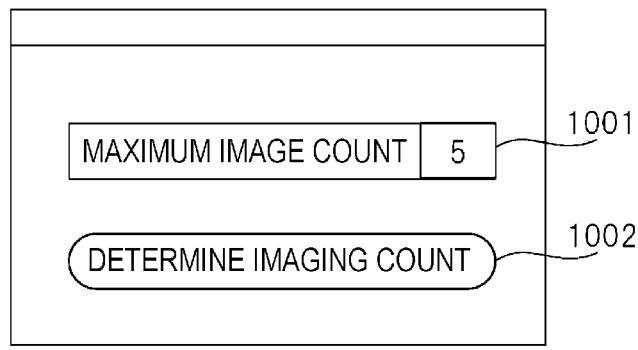
FIG. 10 is a diagram illustrating a screen example related to imaging count determination in the first embodiment.

FIG. 10 illustrates a GUI screen example at the time of the imaging count determination in step S901 in the first embodiment. On this screen, a user inputs the imaging count (N) corresponding to the maximum number of high-picture quality image capturing in a region 1001. After the input, the user can set the imaging count (N) by pressing an enter button region 1002. This imaging count (N) is stored in the imaging parameter storage unit 213. N is 5 in the example of FIG. 10.

In FIG. 9, after step S901, the higher control device 3 performs the loop processing of steps S902 to S906 for each defect position (i). Step S902 is a reference image acquisition step. In step S902, the higher control device 3 uses the reference image acquisition unit 204 to acquire the reference image (learning reference image) of the defect position (i) under the first imaging condition stored in the imaging parameter storage unit 213. Step S903 is an inspection image acquisition step. In step S903, the higher control device 3 uses the inspection image acquisition unit 205 to acquire the inspection image (low-picture quality learning image) of the defect position (i) under the first imaging condition stored in the imaging parameter storage unit 213. Step S902 is the same processing as step S705 described above, and step S903 is the same processing as step S706 described above. The images acquired as a result of the above are stored in the image storage unit 210.

Step S904 is a defect detection step. In step S904, the higher control device 3 performs the processing of defect detection from the inspection image using the inspection and reference images acquired in steps S902 and S903 and the defect detection unit 215. Step S904 is the same processing as step S707 described above.

Next, in step S905, the higher control device 3 determines one or more imaging points of a plurality of high-picture quality images using the imaging point determination unit 208. The imaging point is j, and j is 1 to J. Subsequently, step S906 is loop processing for capturing a high-picture quality image. In this loop processing, the higher control device 3 repeats high-picture quality image acquisition for each imaging point (j) using the high-picture quality image capturing unit 209. In step S906, the higher control device 3 obtains a plurality of high-picture quality images for each imaging point (j) by capturing a high-picture quality image at the imaging point (j) associated with the defect position (i) under the second imaging condition stored in the imaging parameter storage unit 213. The obtained high-picture quality image is stored in the image storage unit 210. This image acquisition flow ends when the loop processing is completed at every defect position (i).

[1-9. Step S905 Imaging Point Determination]

Figure 11:
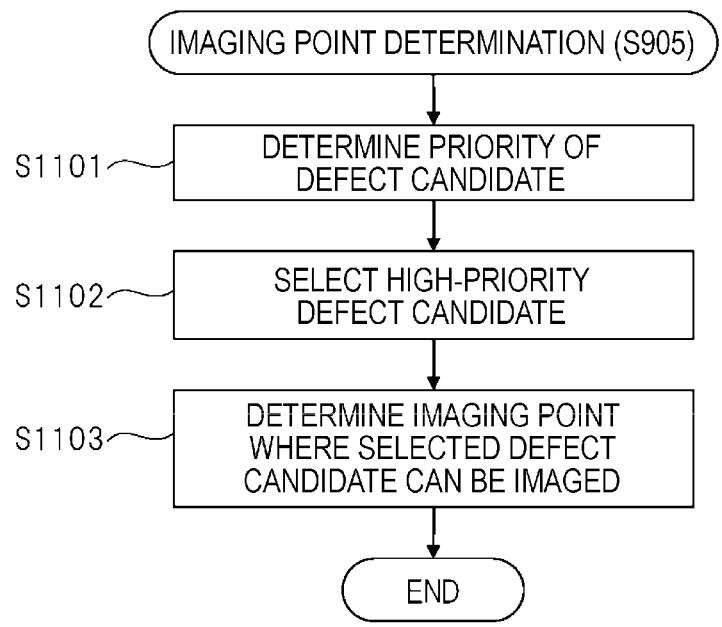
FIG. 11 is a flowchart of imaging point determination step S905 in the first embodiment.

FIG. 11 illustrates a flow related to the high-picture quality image capturing point determination processing in step S905. The flow of FIG. 11 includes steps S1101 to 1103. First, in step S1101, the higher control device 3 determines the priority of the defect candidate in the inspection image (low-picture quality learning image). As this priority, for example, the degree of abnormality used in defect detection step S707 can be used. It can be said that the difference between the inspection image and the reference image increases and the probability of being a defect increases as this degree of abnormality increases. Accordingly, in this example, the higher control device 3 performs calculation and setting such that the priority of the corresponding defect candidate increases as the degree of abnormality increases.

Next, in step S1102, the higher control device 3 selects a high-priority defect candidate. Specifically, the higher control device 3 reads the imaging count (N) determined in step S901 from the imaging parameter storage unit 213 and selects up to N defect candidates corresponding to the imaging count (N) in descending order of priority. For example, in a case where the number of defect candidates in the defect image is 100 and the imaging count (N) is 10, the top 10 defect candidates in terms of the degree of abnormality are selected from the 100 defect candidates. In addition, for example, in a case where the number of defect candidates is 5 and N is 10, five defect candidates are selected.

Next, in step S1103, the higher control device 3 determines one or more imaging points (j) where the up to N defect candidates selected in step S1102 can be imaged. The imaging point is, for example, an imaging position corresponding to the center point of the imaging region of a high-picture quality learning image.

[1-10. Step S1103 Imaging Point Determination]

Figure 12:
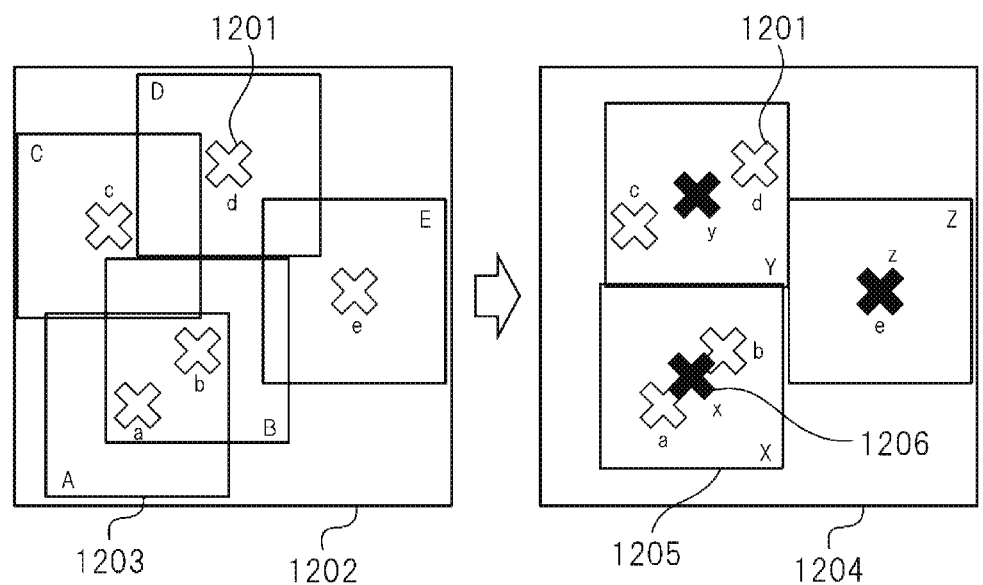
FIG. 12 is an explanatory diagram related to imaging point determination processing in the first embodiment.

FIG. 12 is an explanatory diagram related to the processing of high-picture quality image capturing point determination in step S1103. First, an inspection image 1202 illustrated on the left side will be described. The inspection image 1202 is an inspection image under the first imaging condition corresponding to the defect position (i). In FIG. 12, the position of the defect candidate in the inspection image is represented by a white-filled x mark as in the case of a defect candidate 1201. In this example, one inspection image 1202 includes a plurality of (e.g. five) defect candidates 1201. Conceivable is a case where the plurality of defect candidates 1201 are mutually close in the inspection image 1202 as in this example. A high-picture quality image capturing region 1203, which is rectangular in the drawing, is a region where a high-picture quality image including the defect candidate 1201 is captured.

The higher control device 3 determines the high-picture quality image capturing region 1203 centering on the position coordinates of each defect candidate 1201. Then, in this example, the high-picture quality image capturing regions 1203 overlap to a large extent since the plurality of defect candidates 1201 are mutually close. For example, the two defect candidates 1201 indicated by a and b are at positions relatively close to each other, and the two high-picture quality image capturing regions 1203 indicated by A and B corresponding thereto have a relatively large overlap area. In this case, the partial overlapping region is imaged many times, and thus the imaging efficiency is poor, which results in an increase in setup time.

Accordingly, in the first embodiment, the processing of FIG. 11 is performed as in the case of an inspection image 1204 illustrated on the right side. Since the plurality of defect candidates 1201 are mutually close in the inspection image 1204, in a case where the plurality of defect candidates 1201 can be included in one high-picture quality image capturing region 1205, the higher control device 3 determines the center of gravity of the plurality of defect candidates 1201 included therein as a high-picture quality image capturing point 1206. The high-picture quality image capturing point 1206 is represented by a black-filled x mark. The high-picture quality image capturing region 1205 is a rectangle centering on the high-picture quality image capturing point 1206. For example, regarding the two defect candidates 1201 indicated by a and b, the high-picture quality image capturing point 1206 indicated by x is determined corresponding thereto, and one high-picture quality image capturing region 1205 indicated by X is determined.

As a result of the above processing, three high-picture quality image capturing regions 1205 in the inspection image 1204 on the right side can be obtained with respect to the five high-picture quality image capturing regions 1203 in the inspection image 1202 on the left side. In the inspection image 1204 on the right side, the high-picture quality image capturing regions 1205 hardly overlap, and the plurality of defect candidates 1201 (for example, five) can be captured by capturing a smaller number of (e.g. three) high-picture quality images. In other words, the imaging efficiency is satisfactory and the setup time can be shortened as a result.

After the high-picture quality image capturing region 1205 and the high-picture quality image capturing point 1206 (=j) where every defect candidate selected in step S1102 can be imaged are determined, information such as the coordinates and the number of the imaging points (j) is stored in the imaging parameter storage unit 213.

[1-11. Step S703 Model Learning]

Figure 13:
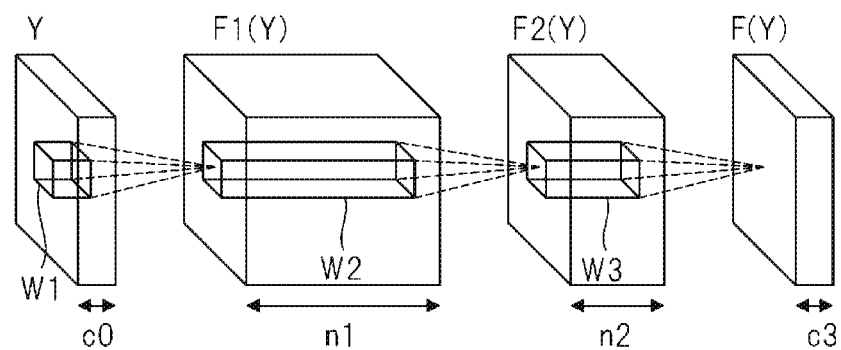
FIG. 13 is an explanatory diagram illustrating a configuration example of a high-picture quality image estimation model in the first embodiment.

FIG. 13 is an explanatory diagram related to a configuration example of a high-picture quality image estimation model related to the model learning of step S703. In the high-picture quality image estimation processing in the first embodiment, the correspondence relationship between the inspection image and the high-picture quality image is machine-learned. Then, using the machine-learned model, the image captured under the second imaging condition is estimated from the inspection or reference image captured under the first imaging condition.

The higher control device 3 performs cropping and expansion processing of a region corresponding to a plurality of high-picture quality images for each imaging point determined in step S905 with respect to the inspection image captured in step S903 to create a pair of a cropped image and a high-picture quality image. Here, the image cropped from the inspection image is referred to as a low-picture quality image. Although each of the low-picture quality image and the high-picture quality image includes the same region, the low-picture quality image is processed such that the imaging field of view is expanded. Accordingly, this low-picture quality image is, for example, a blurred image as compared with the high-picture quality image.

In the first embodiment, known deep learning is used as a machine learning implementation method. Specifically, a convolutional neural network (CNN) is used as a model. FIG. 13 illustrates an example in which a neural network having a three-layer structure is used as a specific example of the CNN.

In the CNN of FIG. 13, Y indicates an input low-picture quality image and F(Y) indicates an estimation result as an output. In addition, F1(Y) and F2(Y) indicate intermediate data between the input and the estimation result. The intermediate data F1(Y), the intermediate data F2(Y), and the estimation result F(Y) are calculated by the following Equations 1 to 3.

$$F1(Y)=\max(0, W1*Y+B1) \quad \text{Equation 1:}$$

$$F2(Y)=\max(0, W2*F1(Y)+B2) \quad \text{Equation 2:}$$

$$F(Y)=W3*F2(Y)+B3 \quad \text{Equation 3:}$$

Here, the symbol * indicates a convolution operation, W1 indicates n1 filters with a size of c0×f1×f1, c0 indicates an input image channel count, and f1 indicates the size of the spatial filter. In the CNN of FIG. 13, an n1-dimensional feature map can be obtained by convolving the c0×f1×f1 size filter n1 times in the input image Y. B1 is an n1-dimensional vector and a bias component corresponding to the n1 filters. Likewise, W2 is n2 filters with a size of n1×f2×f2, B2 is an n2-dimensional vector, W3 is c3 filters with a size of n2×f3×f3, and B3 is a c3-dimensional vector. c0 and c3 are values determined by the channel counts of the low-and high-picture quality images. In addition, f1, f2, n1, and n2 are determined by a user before the learning sequence. For example, f1 may be 9, f2 may be 5, n1 may be 128, and n2 may be 64. The various parameters described above are examples of model parameters.

In model learning step S703, the model parameters to be adjusted are W1, W2, W3, B1, B2, and B3. The higher control device 3 uses the low-picture quality image in which an image region is cropped from the inspection image captured under the first imaging condition and the imaging field of view is expanded as the input (Y) of the CNN model. The higher control device 3 adjusts the parameters of the CNN model using the high-picture quality image captured under the second imaging condition as the estimation result (F(Y)). The higher control device 3 stores a parameter in which the estimation result by the model matches the high-picture quality image in the high-picture quality image estimation parameter storage unit 212 as an adjustment result.

In the model parameter adjustment described above, error back propagation, which is common in neural network learning, may be used. In addition, in calculating an estimation error, a mini-batch method may be adopted although every acquired learning image pair (pair of low- and high-picture quality images described above) may be used. In other words, several images may be randomly extracted from the learning image pair and the high-picture quality image estimation processing parameter may be updated repeatedly. Further, a patch image may be randomly cropped from one learning image pair and used as the input image (Y) of the neural network. Efficient learning is possible as a result. Other configurations may be used without being limited to the configuration of the CNN illustrated in this example. For example, the number of layers may be changed, a network having four or more layers may be used, or a configuration having a skip connection may be used.

[1-12. Step S704 Parameter Adjustment]

Figure 14:
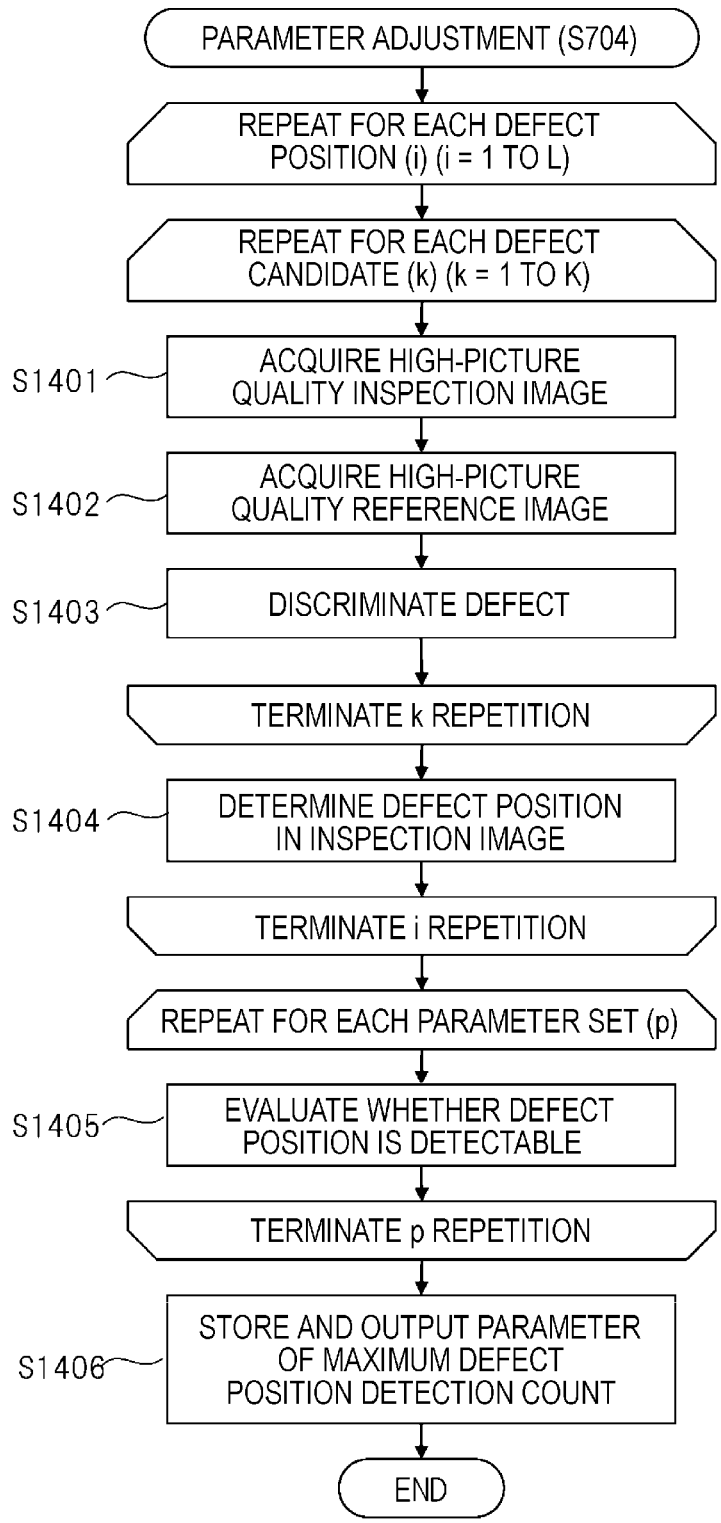
FIG. 14 is a flowchart of parameter adjustment step S704 in the first embodiment.

FIG. 14 illustrates a detailed processing flow related to the defect detection parameter adjustment in step S704. The flow of FIG. 14 includes steps S1401 to S1406. Here, an image estimated from an inspection image (low-picture quality learning image) using a high-picture quality image estimation model is referred to as a high-picture quality inspection image (high-picture quality learning image). In this parameter adjustment, first, in order to determine a detailed defect position in the inspection image of the defect position (i), the higher control device 3 performs the loop processing of steps S1401 to S1403 on the defect candidate associated with the defect position (i). The defect candidate is k, and k is 1 to K. At this time, high-accuracy defect position determination is possible using the high-picture quality inspection image and a high-picture quality reference image corresponding to the high-picture quality inspection image.

[1-13. Step S1401 Acquisition of High-Picture Quality Inspection Image]

Figure 15:
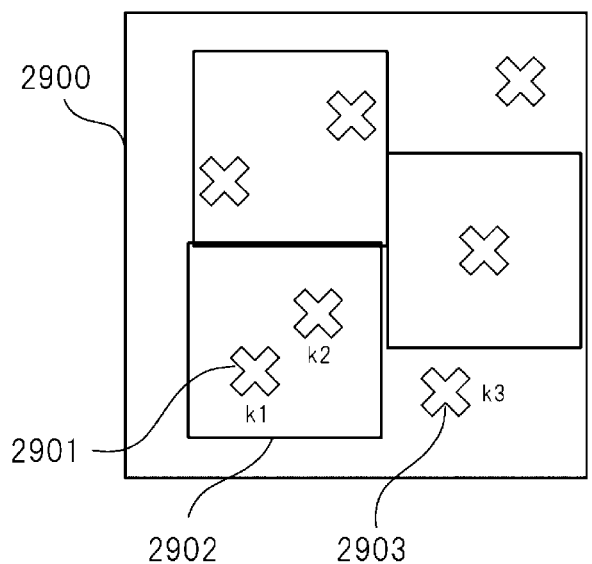
FIG. 15 is an explanatory diagram related to high-picture quality inspection image acquisition processing in the first embodiment.

FIG. 15 is an explanatory diagram related to the high-picture quality inspection image acquisition processing of step S1401. One inspection image 2900 of FIG. 15 includes a plurality of defect candidates (k) 2901. In step S1401, the higher control device 3 acquires high-picture quality inspection images with regard to the plurality of defect candidates (k) in the inspection image detected in step S904. Specifically, in a case where the position of the defect candidate overlaps (i.e. is included in) an imaging region 2902 of the high-picture quality inspection image determined in step S905 as in the defect candidate 2901 indicated by k1, since the high-picture quality inspection image corresponding to the defect candidate 2901 is acquired in step S906, the high-picture quality inspection image is selected from the image storage unit 210. Such processing is described as high-picture quality inspection image selection processing.

In a case where the number of defect candidates detected in step S904 is larger than the imaging count N determined in step S901 (maximum number of high-picture quality image capturing), as in a defect candidate 2903 indicated by k3 in FIG. 15, for example, in the low-priority defect candidate, a high-picture quality image including the defect candidate is not captured. In this regard, in a case where the position of the defect candidate does not overlap (is not included in) the imaging region 2902 of the high-picture quality inspection image as described above, the higher control device 3 estimates the high-picture quality inspection image using the high-picture quality image estimation unit 217. Such processing is described as high-picture quality inspection image estimation processing. Details of the high-picture quality inspection image estimation processing will be described later.

After step S1401, in step S1402, the higher control device 3 acquires a high-picture quality reference image corresponding to the high-picture quality inspection image. As a method for acquiring the high-picture quality reference image, a method for estimating a high-picture quality reference image from a reference image and a method for combining a high-picture quality reference image from a high-picture quality inspection image can be applied. In the first embodiment, any method may be applied. Details of the high-picture quality reference image estimation processing and the high-picture quality reference image composition processing corresponding to these methods will be described later.

After step S1402, in step S1403, the higher control device 3 performs defect discrimination processing using the high-picture quality inspection image and the high-picture quality reference image. In the defect discrimination processing, for example, the degree of abnormality obtained by comparison between the high-picture quality inspection image and the high-picture quality reference image is used as a discrimination index value. The difference between the high-picture quality inspection image and the high-picture quality reference image increases as the degree of abnormality increases. Accordingly, the higher control device 3 determines the defect candidate of the inspection image corresponding to the high-picture quality inspection image with the maximum degree of abnormality as a defect. The index value of the defect discrimination processing is not limited to the degree of abnormality.

Next, in step S1404, the higher control device 3 performs the processing of determining a defect position in the inspection image from the defect discrimination result obtained in step S1403. The higher control device 3 determines the position on the inspection image of the defect candidate determined to be a defect by the defect discrimination processing as a defect position.

After a detailed defect position is determined in every inspection image, in step S1405, the higher control device 3 evaluates whether the defect position in the inspection image can be detected for each defect detection parameter set (referred to as p). In the first embodiment, the number of detections of the defect position determined in step S1404 is used as an evaluation index at this time.

Finally, in step S1406, the higher control device 3 stores in the defect detection parameter storage unit 211 and outputs the defect detection parameter of maximum defect position detection count. The parameter adjustment flow of FIG. 14 ends as a result.

[1-14. High-Picture Quality Inspection Image Estimation Processing]

Figure 16:
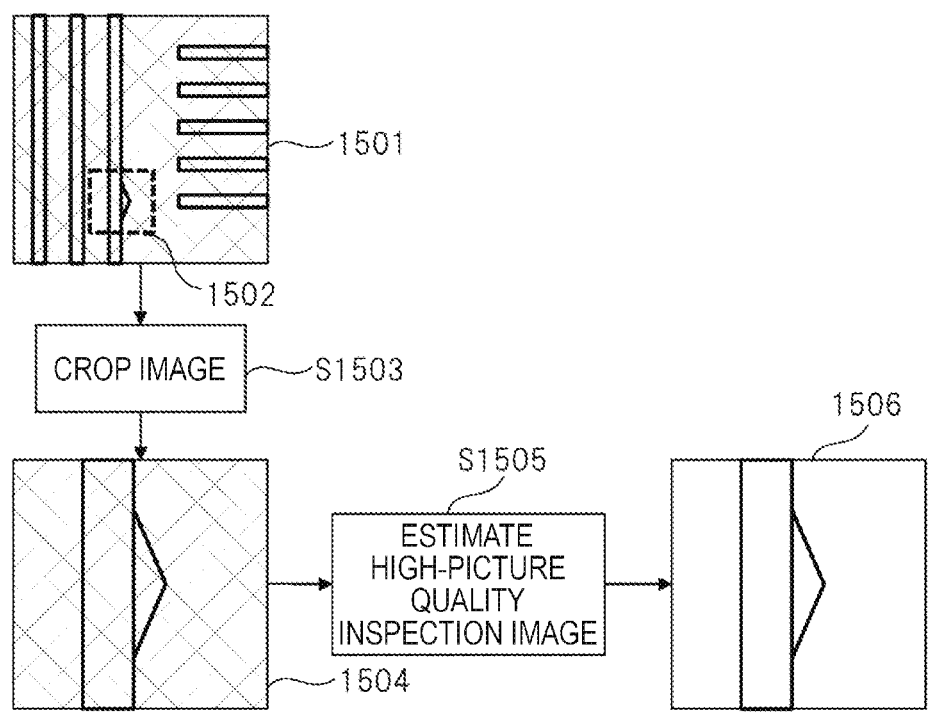
FIG. 16 is a schematic diagram illustrating an example of high-picture quality inspection image estimation processing in the first embodiment.

The high-picture quality inspection image estimation processing will be described with reference to FIG. 16. First, the higher control device 3 determines a cropping region 1502 indicated by the broken line centering on the defect candidate in an inspection image 1501 and performs image cropping step S1503. In this example, as illustrated in the drawing, the defect candidate is a part slightly protruding horizontally from the vertical line. Then, the higher control device 3 estimates and obtains a high-picture quality inspection image 1506 by performing high-picture quality inspection image estimation step S1505 on a cropped image 1504 using the high-picture quality image estimation unit 217.

[1-15. High-Picture Quality Reference Image Estimation Method]

Figure 17:
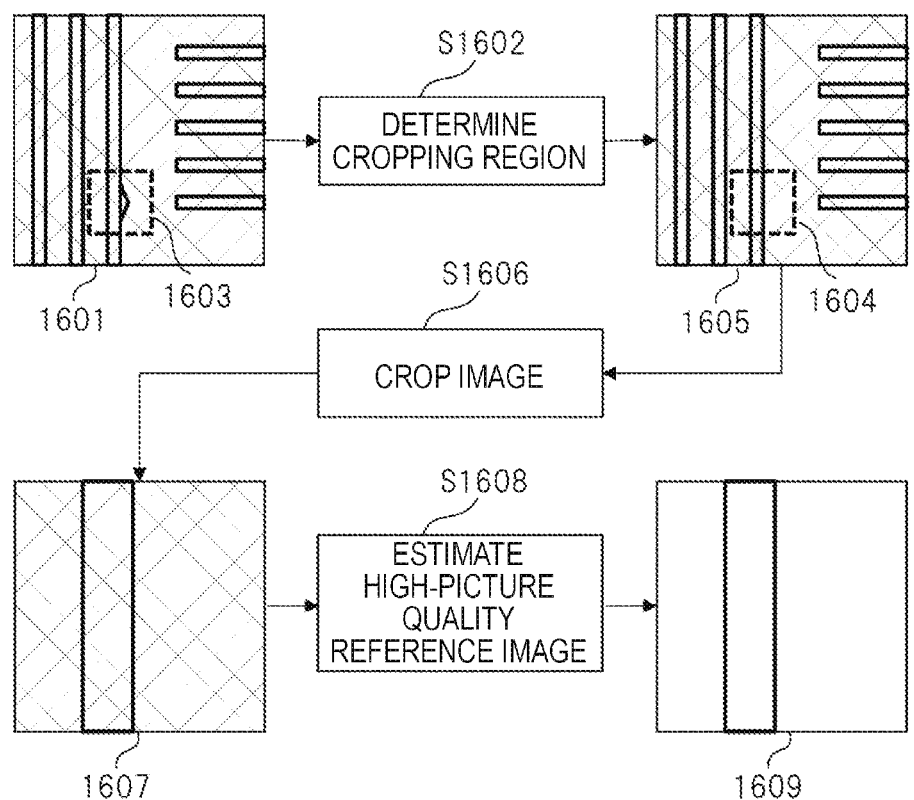
FIG. 17 is a schematic diagram illustrating an example of high-picture quality reference image estimation processing in the first embodiment.

A method for estimating the high-picture quality reference image will be described with reference to FIG. 17. First, the higher control device 3 performs reference image cropping region determination step S1602 using an inspection image 1601. The inspection image 1601 includes a region 1603 of high-picture quality inspection image acquisition in step S1401. Here, in a case where the high-picture quality inspection image selection processing described above is performed, the imaging region of the selected high-picture quality image is determined as the region 1603. In a case where the high-picture quality inspection image estimation processing described above is performed, the cropping region in image cropping step S1503 in FIG. 16 is determined as the region 1603.

In step 1602, the higher control device 3 selects a cropping region 1604 corresponding to the region 1603 of high-picture quality inspection image acquisition in step S1401 from a reference image 1605 corresponding to the inspection image 1601 in the defect candidate (k) of the inspection image 1601 at the defect position (i).

After determining the cropping region 1604, the higher control device 3 performs image cropping step S1606. Step S1606 is the same processing as step S1503 in FIG. 16. Then, the higher control device 3 obtains a high-picture quality reference image 1609 by performing high-picture quality reference image estimation step S1608 using the high-picture quality image estimation unit 217 on a cropped reference image 1607.

[1-16. High-Picture Quality Reference Image Composition Method]

Figure 18:
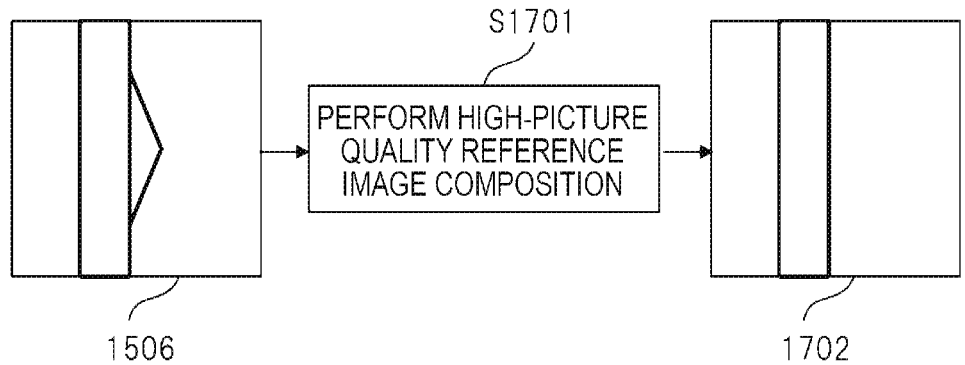
FIG. 18 is a schematic diagram illustrating an example of high-picture quality reference image composition processing in the first embodiment.

A method for combining the high-picture quality reference image will be described with reference to FIG. 18. The higher control device 3 performs high-picture quality reference image composition processing in step S1701 on the high-picture quality inspection image 1506 obtained in step S1401. As for this composition processing, for example, the reference image composition processing described in Patent Document 1 can be similarly applied. As a result, a defect-free high-picture quality reference image 1702 is combined. The "composition" here is the processing of creating a database in which a reference image is pre-collected and replacing a characteristic region in an inspection image with a similar region of the database but is applicable without being limited to the processing.

[1-17. User Interface]

In FIG. 1, the user operates the sample observation device 1 of the first embodiment using the input-output terminal 6. The user watches and operates the GUI screen provided by the user interface control unit 106 of the higher control device 3.

Figure 19:
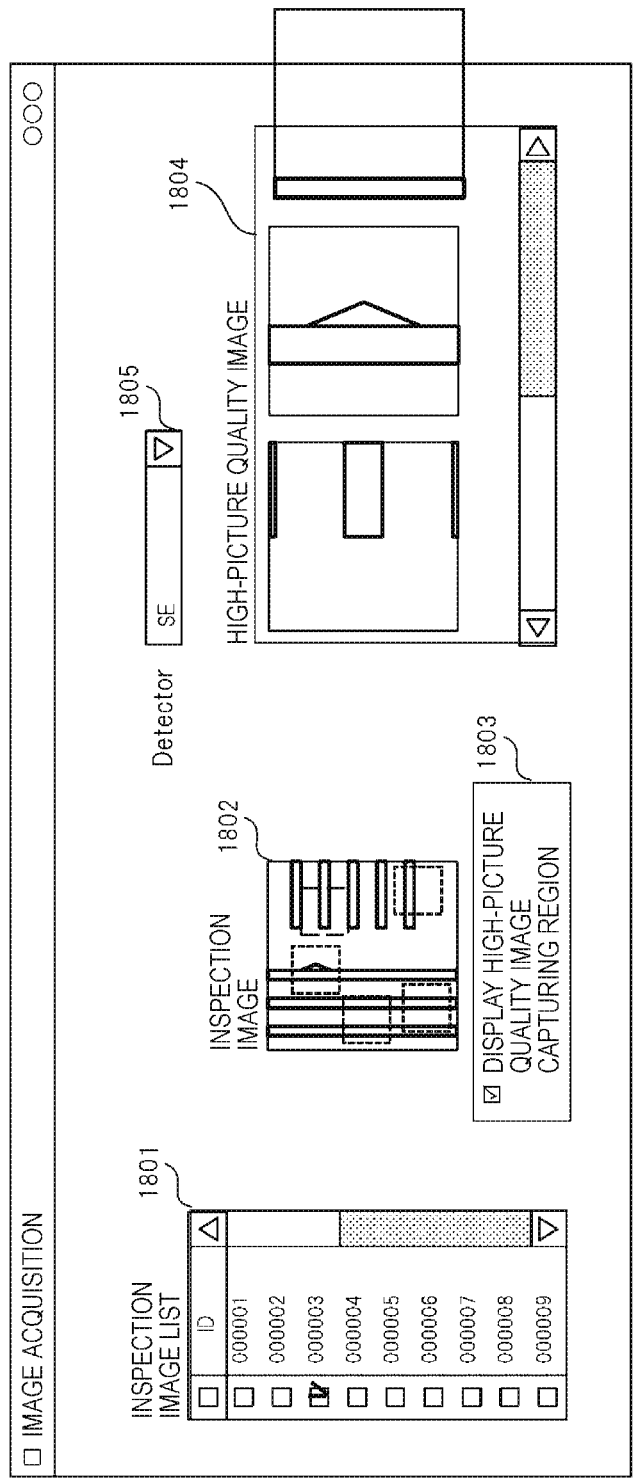
FIG. 19 is a diagram illustrating a screen example related to image acquisition in the first embodiment.

FIG. 19 illustrates a GUI screen example related to the image acquisition in step S702 in the first embodiment. On this screen, the IDs of image acquisition-completed inspection images are displayed as a list in an inspection image list region 1801. The user can select an ID from the list. In an inspection image region 1802, the inspection image of the ID selected on the list is displayed. At this time, in a case where the check of "display high-picture quality image capturing region" in a check box region 1803 is selected, in the region 1802, the imaging region of a high-picture quality image is displayed in, for example, a rectangular shape with a broken line. In addition, in a high-picture quality image region 1804, a high-picture quality inspection image related to the inspection image of the ID selected on the list (corresponding to high-picture quality image capturing region of region 1802) is displayed. For example, a plurality of high-picture quality inspection images are displayed in parallel. In a detector region 1805, the detection target and image type corresponding to the detector 111 described above can be selected.

Figure 20:
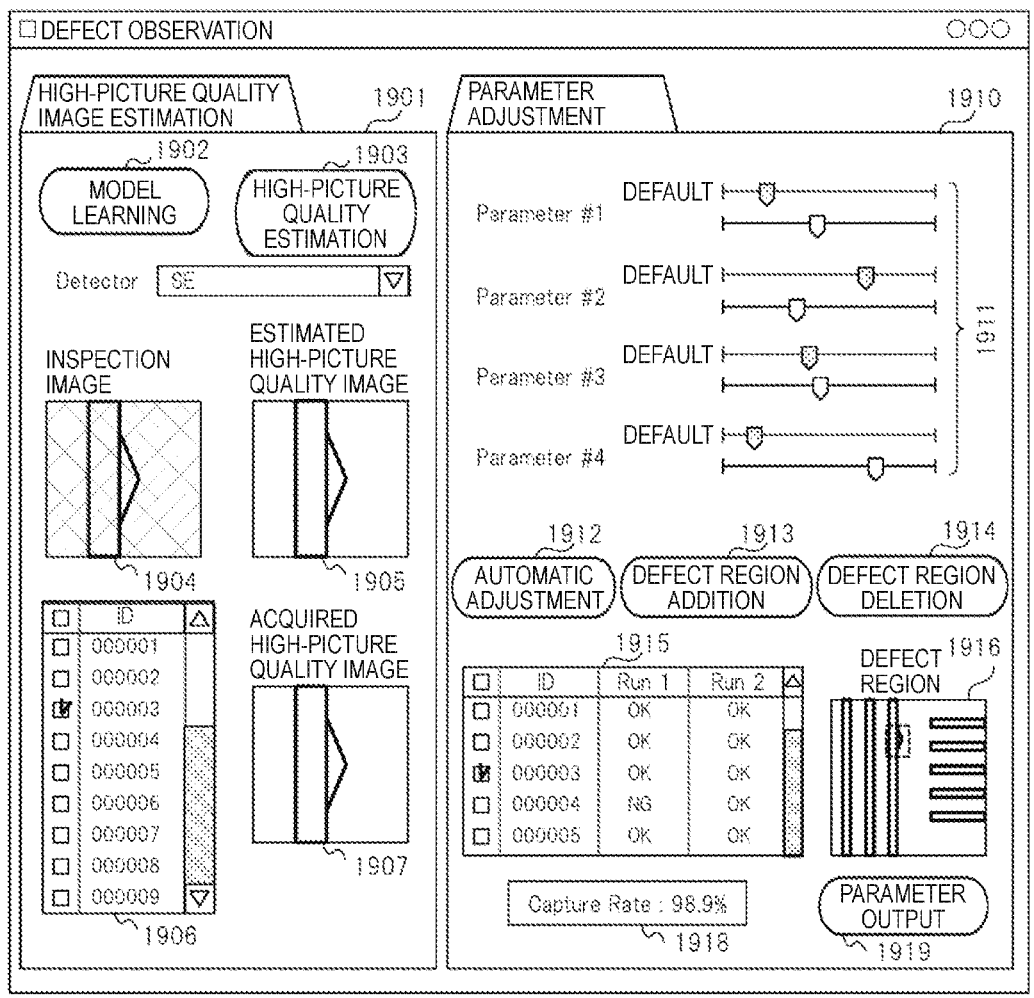
FIG. 20 is a diagram illustrating a screen example related to model learning and parameter adjustment in the first embodiment.

FIG. 20 illustrates a GUI screen example related to the high-picture quality image estimation model learning in step S703 and the defect detection parameter adjustment in step S704 described above. This screen is roughly divided into and has a high-picture quality image estimation region 1901 and a parameter adjustment region 1910. The region 1901 is used for learning the high-picture quality image estimation model. A region 1902 is a model learning instruction button and a button for manually calling the model learning unit 216 in order to execute high-picture quality image estimation model learning processing. A region 1903 is a high-picture quality image estimation instruction button and a button for manually calling the high-picture quality image estimation unit 217. An inspection image is displayed in a region 1904. In a region 1905, a high-picture quality image estimated using the high-picture quality image estimation unit 217 is displayed. In a region 1906, an inspection image ID list is displayed. In a region 1907, an acquired high-picture quality image is displayed for comparison with the estimated high-picture quality image of the region 1905. The higher control device 3 reads the acquired high-picture quality image from the image storage unit 210 and displays the image in this region 1907.

A region 1910 is used for defect detection parameter adjustment. Defect detection parameters (plurality of parameters) are displayed in an upper region 1911 in the region 1910 using a component such as a slider. In this example, the user can manually adjust each parameter value by changing the slider position of each parameter (#1 to #4). In addition, the default value for each parameter is displayed by a gray slider.

A region 1912 is an automatic adjustment instruction button. In a case where the region 1912 is pressed, the higher control device 3 executes the processing by the parameter adjustment unit 218 to automatically adjust a defect detection parameter. The higher control device 3 automatically changes the display of the value (position) of the slider of each parameter in the upper region 1911 in accordance with the value of the adjusted defect detection parameter.

In a region 1915, an inspection image list is displayed as an ID list, and the success or failure (OK/NG) of actual defect detection in the inspection image is displayed for each execution item such as "Run1" and "Run2". In a region 1916, a defect region (defect part-including region) in the inspection image is displayed as a region surrounded by a broken line. In addition, in the region 1916, the user can manually specify a defect region. A region 1913 is a defect region addition instruction button and a button for calling the processing of defect region addition. In addition, a region 1914 is a defect region deletion instruction button and a button for calling the processing of deleting a defect region on the inspection image. A region 1918 is a region for displaying a defect capture rate. A region 1919 is a parameter output instruction button and a button for calling the processing of storing the defect detection parameter set in the region 1910 in the defect detection parameter storage unit 211.

[1-18. Effect, etc.]

As described above, in the sample observation device and method of the first embodiment, an inspection image, a reference image, and a plurality of high-picture quality images are acquired for each defect coordinates of the defect position information 8 using the SEM 101 that is the imaging device 2, a high-picture quality image estimation model is learned using the inspection image and the high-picture quality image, and a defect detection parameter is adjusted using a high-picture quality inspection image and a high-picture quality reference image. According to the first embodiment, a user can easily improve defect detection-related accuracy. According to the first embodiment, the accuracy of the high-picture quality image estimation model can be improved, and the usability related to the creation of a recipe of an ADR function can also be improved. According to the first embodiment, a plurality of high-picture quality images can be captured for each defect position indicated by the defect position information 8. Accordingly, the possibility of capturing a defect in the inspection image in the high-picture quality image is improved, and thus the accuracy of the high-picture quality estimation model is improved. As a result, the accuracy of defect detection processing parameter adjustment is improved. In addition, the accuracy of the high-picture quality image estimated for defect observation is improved. In addition, according to the first embodiment, the functions described above are provided to a user, and the user can operate while watching the GUI screen described above. Accordingly, the usability at the time of defect observation work is improved.

The user can set the imaging count (N) on the screen of FIG. 10 with regard to the step S901 described above. The effects of this are as follows. In general, regarding the number of employed images in an ADR function using a machine learning model, there is a trade-off relationship between accuracy and processing time. An increase in image count leads to a longer processing time although the increase may lead to accuracy enhancement. In this regard, in the first embodiment, a user can adjust the imaging count (N), and thus it is easy to make an adjustment to accuracy and processing time preferred by the user. As a modification example, a system including the sample observation device 1 can be configured to automatically determine and set the imaging count (N) without being limited to the configuration in which a user can variably set the imaging count (N).

Second Embodiment

A second embodiment will be described with reference to the drawings starting from FIG. 21. The second embodiment and so on are similar in basic configuration to the first embodiment. Hereinafter, configuration parts in the second embodiment and so on that are different from those of the first embodiment will be mainly described.

In the second embodiment, when a reference image is generated from an inspection image, both a low-picture quality image and a high-picture quality image are generated by composition. In other words, in the second embodiment, a low-picture quality reference image is generated by composition from a low-picture quality inspection image, and a high-picture quality reference image is generated by composition from a high-picture quality inspection image. At the time of image acquisition in defect observation, the acquisition time decreases and the throughput is improved as the number of images to be captured decreases. In the second embodiment, a reference image is generated from an inspection image, and thus a defect is observed with reference image capturing omitted. As for the GUI in the second embodiment, the GUI as in FIGS. 10, 19, and 20 described in the first embodiment can be similarly applied.

[2-1. Reference Image Acquisition Unit 2001]

Figure 21:
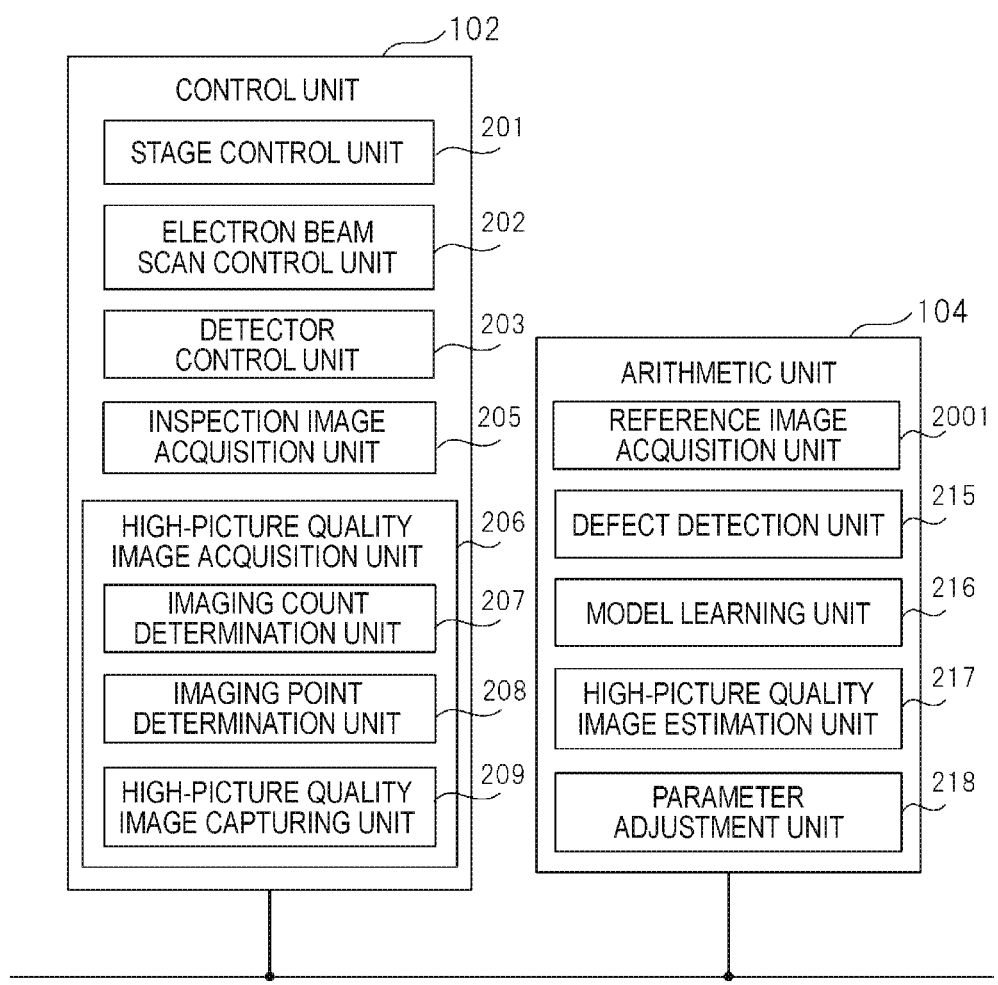
FIG. 21 is a diagram illustrating the functional block configuration of a higher control device in a second embodiment.

FIG. 21 illustrates a functional block configuration realized by the control unit 102 and the arithmetic unit 104 of the higher control device 3 in the second embodiment. The reference image acquisition unit in the configuration of the second embodiment is the configuration part thereof that is mainly different from the first embodiment. In the second embodiment, as illustrated in FIG. 21, a reference image acquisition unit 2001 is configured in the arithmetic unit 104. The reference image acquisition unit 2001 is configured in the arithmetic unit 104 in order to perform only arithmetic processing without controlling the SEM 101. The reference image acquisition unit 2001 reads an inspection image acquired under the first imaging condition by the inspection image acquisition unit 205 from the image storage unit 210 of the storage unit 103 (not illustrated, same as in FIG. 2) and acquires a defect-free reference image by executing reference image composition processing on the inspection image. As for the reference image composition processing, for example, processing similar to the reference image composition processing described in Patent Document 1 can be applied.

[2-2. Overall Processing]

Figure 22:
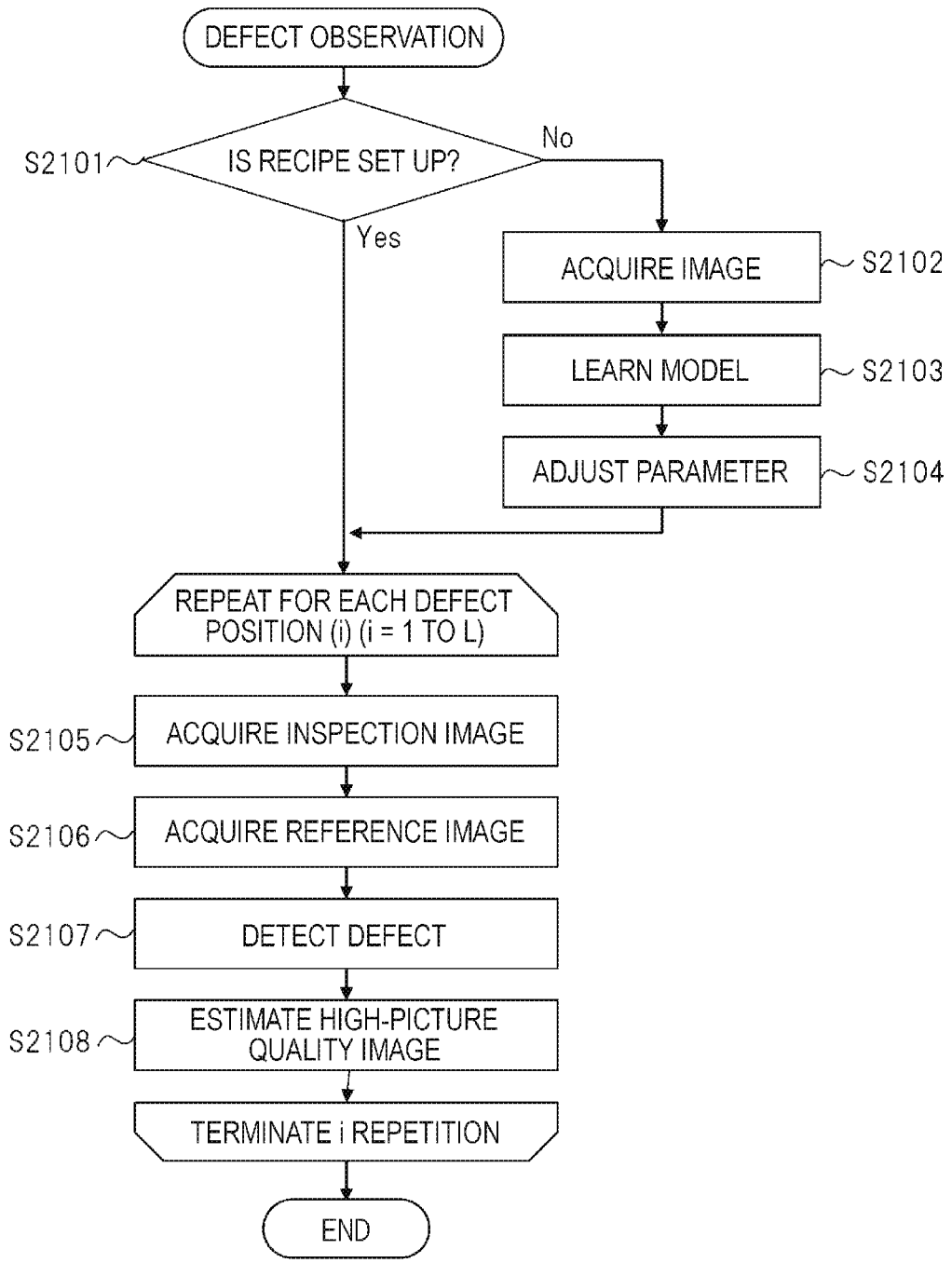
FIG. 22 is a flowchart illustrating the entire processing of a sample observation device in the second embodiment.

A defect observation method executed by the sample observation device 1 of the second embodiment will be described. FIG. 22 illustrates the processing and operation of the sample observation device 1 of the second embodiment as a whole. The flow of FIG. 21 includes steps S2101 to S2108. At the start of the defect observation, in step S2101 (corresponding to S701 in FIG. 7), it is determined whether a defect detection processing-related recipe is set up. The processing proceeds to step S2102 in a case where the recipe is not yet to be set up. The processing proceeds to step S2105 in a case where the recipe is set up.

In step S2102, the higher control device 3 uses the reference image acquisition unit 2001, the inspection image acquisition unit 205, and the high-picture quality image acquisition unit 206 to acquire an image used in high-picture quality image estimation model learning and defect detection parameter adjustment. Model learning is performed in step S2103 (corresponding to S703 in FIG. 7). Parameter adjustment is performed in step S2104 (corresponding to S704 in FIG. 7).

In a case where the recipe is set up or after setup by steps S2102 to S2104, the loop processing of steps S2105 to S2108 is performed for each defect position (i) of the defect position information 8. In step S2105 (corresponding to S706 in FIG. 7), the higher control device 3 acquires an inspection image at the defect position (i) using the inspection image acquisition unit 205. In step S2106, the higher control device 3 obtains a reference image by performing reference image composition processing using the inspection image read from the image storage unit 210 in the reference image acquisition unit 2001. The obtained reference image is stored in the image storage unit 210. Defect detection is performed in step S2107 (corresponding to S707 in FIG. 7). High-picture quality image estimation is performed in step S2108 (corresponding to S708 in FIG. 7). This defect observation flow ends when the processing of steps S2105 to S2108 is performed at every defect position (i).

[2-3. Step S2102 Image Acquisition]

Figure 23:
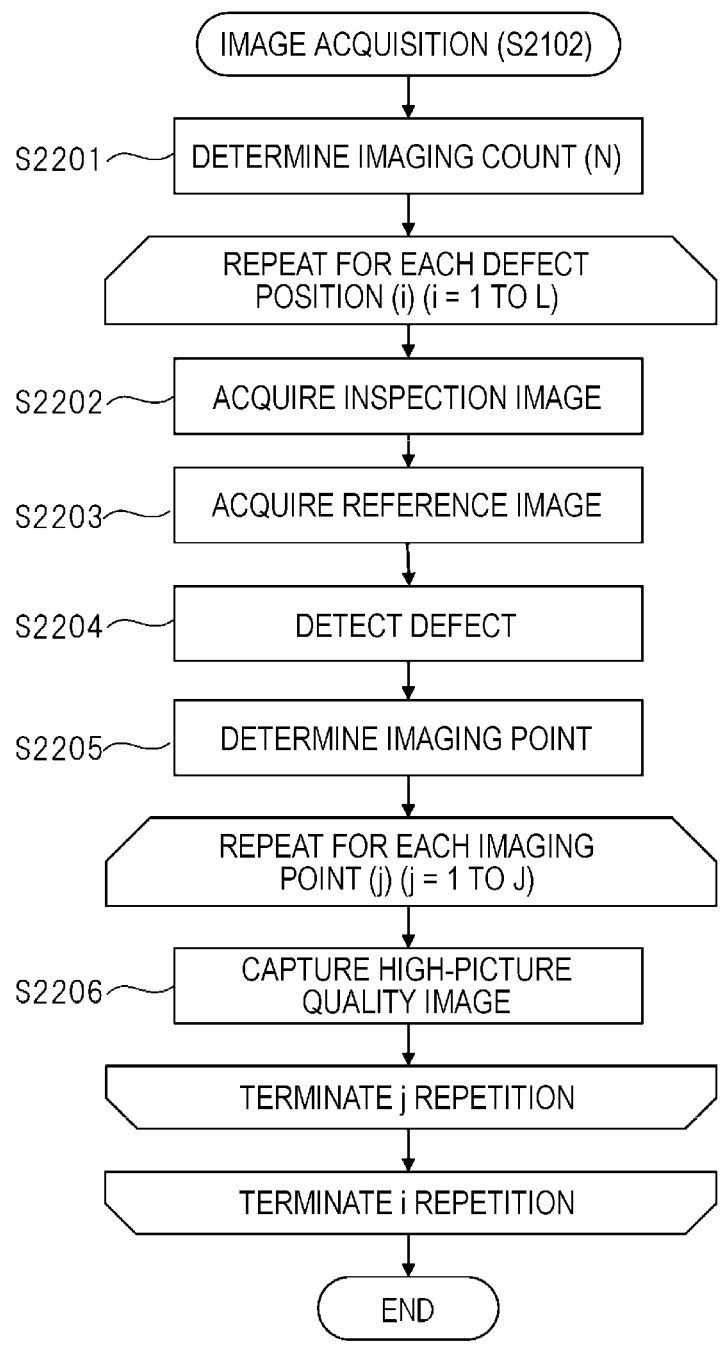
FIG. 23 is a flowchart of image acquisition step S2102 in the second embodiment.

FIG. 23 illustrates a flow related to the image acquisition processing of step S2102. The higher control device 3 performs this image acquisition processing using the inspection image acquisition unit 205, the reference image acquisition unit 2001, and the high-picture quality image acquisition unit 206. First, in step S2201 (corresponding to S901 in FIG. 9), the higher control device 3 determines the imaging count (N) (maximum number of high-picture quality image capturing). After step S2201, the loop processing of steps S2202 to S2206 is performed for each defect position (i) of the defect position information 8.

In step S2202 (corresponding to S903 in FIG. 9), the higher control device 3 acquires the inspection image of the defect position (i) under the first imaging condition stored in the imaging parameter storage unit 213. In step S2203, the higher control device 3 combines the reference image of the defect position (i) using the inspection image read from the image storage unit 210 in the reference image acquisition unit 2001. Step S2203 is the same processing as step S2106 described above. The combined reference image is stored in the image storage unit 210.

Next, in step S2204 (corresponding to S904 in FIG. 9), the higher control device 3 performs defect detection. In step S2205 (corresponding to S905 in FIG. 9), the higher control device 3 determines the imaging point (j) of the high-picture quality image. After the imaging point (j) is determined, in step S2206 (corresponding to S906 in FIG. 9), the higher control device 3 captures the high-picture quality image at the imaging point (j) at the defect position (i) under the second imaging condition stored in the imaging parameter storage unit 213. The captured high-picture quality image is stored in the image storage unit 210. This image acquisition flow ends when the processing of steps S2202 to S2206 is completed at every defect position.

[2-4. Effect, etc.]

As described above, according to the second embodiment, reference image composition can be performed by capturing only an inspection image. Accordingly, according to the second embodiment, reference image capturing can be omitted and defect observation-related throughput improvement can be achieved.

Third Embodiment

A third embodiment will be described with reference to the drawings starting from FIG. 24. In the first and second embodiments described above, a method for using a reference image in order to detect a defect in an inspection image in high-picture quality image estimation model learning and defect detection parameter adjustment has been described. In the third embodiment, defect observation that requires no reference image is realized by imaging the entire region of an inspection image with a high-picture quality image. In the third embodiment, reference image acquisition is omitted, and thus defect observation-related throughput improvement is achieved. The ADR processing in the third embodiment is realized using machine learning. As for the GUI in the third embodiment, the GUI of the first embodiment described above can be similarly applied.

[3-1. Functional Block]

Figure 24:
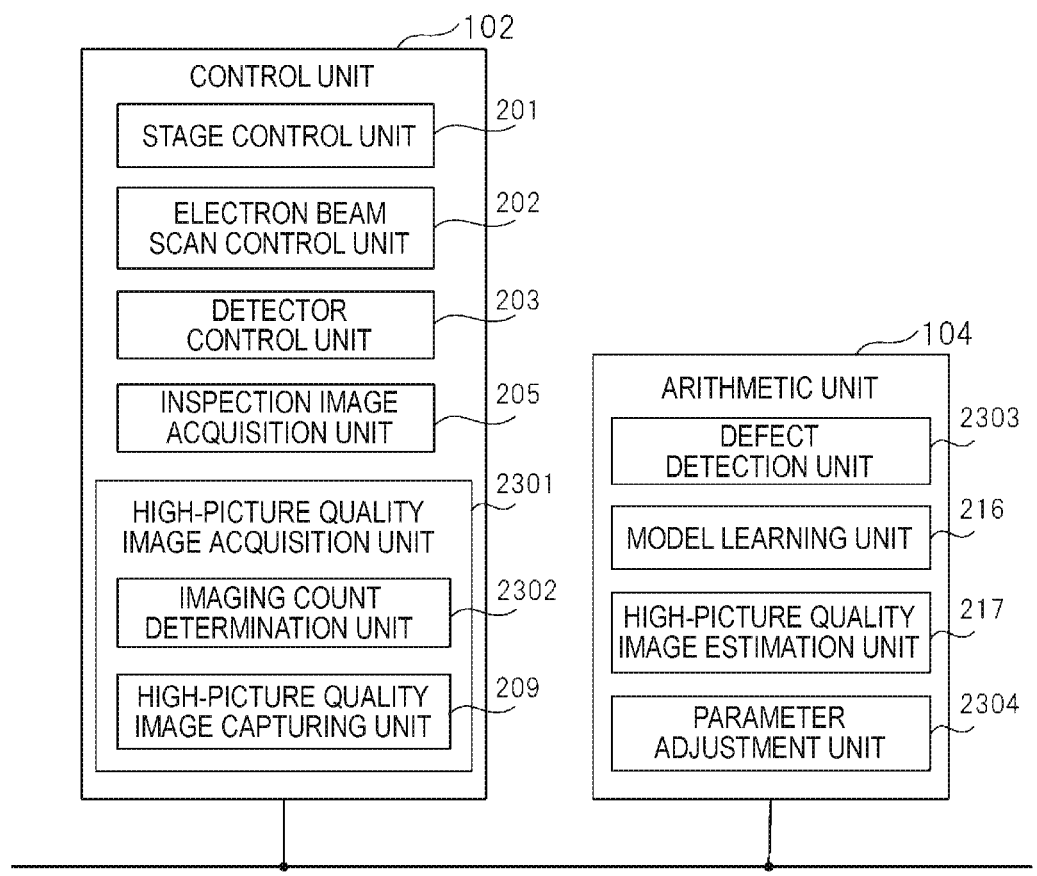
FIG. 24 is a diagram illustrating the functional block configuration of a higher control device in a third embodiment.

FIG. 24 illustrates a functional block configuration of the control unit 102 and the arithmetic unit 104 of the higher control device 3 in the third embodiment. The mainly different configuration part in the third embodiment is the configurations in the control unit 102 and the arithmetic unit 104 and, first, the control unit 102 or the arithmetic unit 104 has no reference image acquisition unit. In addition, the configuration of a high-picture quality image acquisition unit 2301 is also different and no imaging count determination unit is provided. Further, in the third embodiment, an imaging point determination unit 2302 is provided in the high-picture quality image acquisition unit 2301 of the control unit 102 such that imaging count determination unit is unnecessary. In addition, the processing and operation of a defect detection unit 2303 are also different from those of the first and second embodiments, and thus the processing and operation of a parameter adjustment unit 2304 are also different.

[3-2. Defect Observation]

Figure 25:
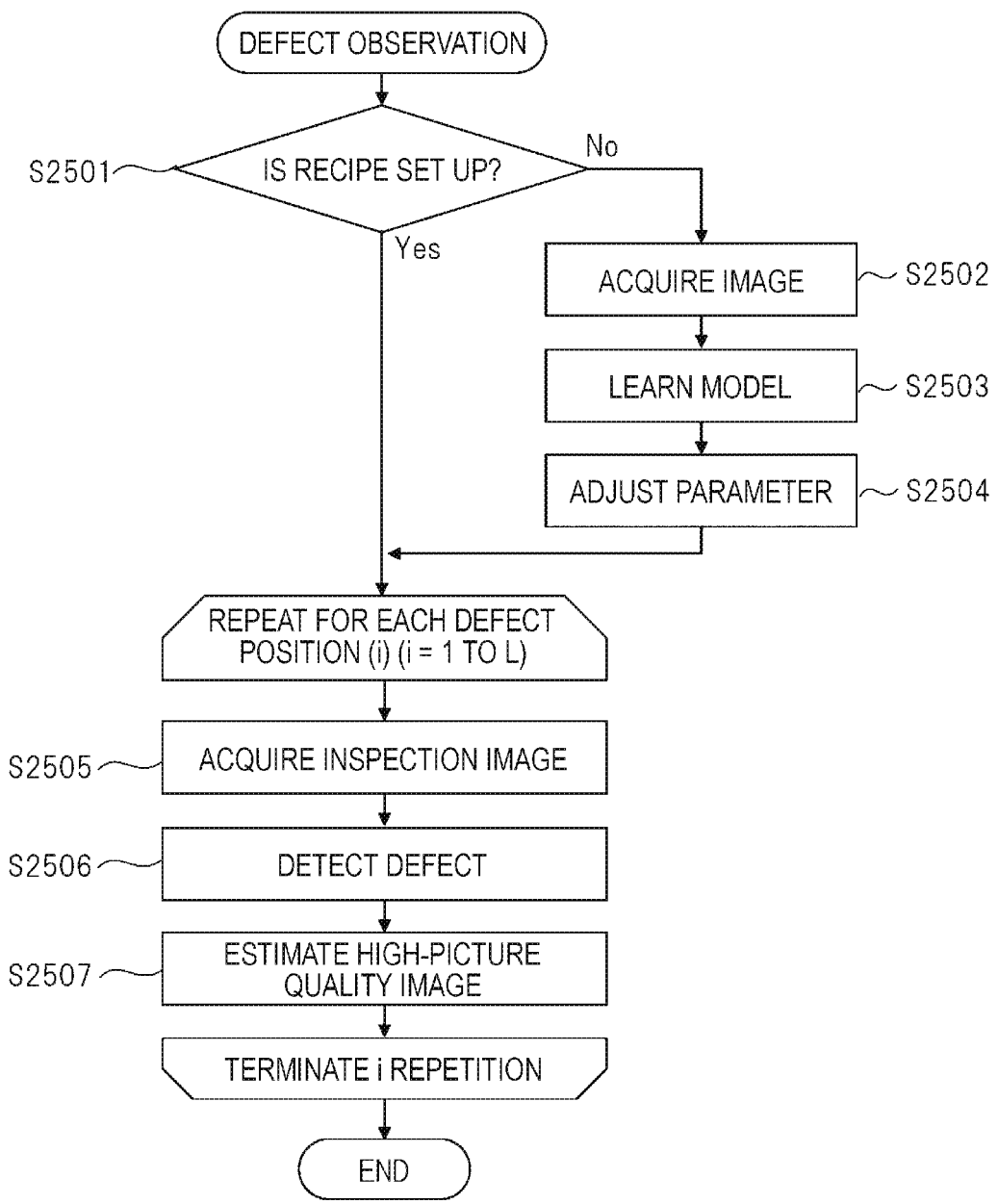
FIG. 25 is a flowchart illustrating the entire processing of a sample observation device in the third embodiment.

A defect observation method executed by the sample observation device 1 of the third embodiment will be described. FIG. 25 illustrates the processing and operation of the sample observation device 1 of the third embodiment as a whole. At the start of the defect observation, in step S2501 (corresponding to S701 in FIG. 7), it is determined whether a defect detection processing-related recipe is set up. The processing proceeds to step S2502 in a case where the recipe is not yet to be set up. The processing proceeds to step S2505 in a case where the recipe is set up. In step S2502, the higher control device 3 uses the inspection image acquisition unit 205 and the high-picture quality image acquisition unit 2301 to acquire an image used in high-picture quality image estimation model learning and defect detection parameter adjustment. Subsequently, model learning is performed in step S2503 (corresponding to S703 in FIG. 7). Subsequently, parameter adjustment is performed in step S2504 (corresponding to S704 in FIG. 7). In the third embodiment, the same model as in the first embodiment (here, first model) is used in the model learning of step S2503. The parameter adjustment in step S2504 is parameter adjustment related to the defect detection processing in step S2506.

In a case where the recipe is set up or after setup by steps S2502 to S2504, the loop processing of steps S2505 to S2507 is performed for each defect position (i) of the defect position information 8. In step S2505 (corresponding to S706 in FIG. 7), the higher control device 3 acquires an inspection image at the defect position (i) under the first imaging condition stored in the imaging parameter storage unit 213 using the inspection image acquisition unit 205. In step S2506, the higher control device 3 detects a defect in the inspection image using the defect detection unit 2303. In the third embodiment, in the defect detection processing of step S2506, a model different from the first model of step S2503 (here, second model) is used. The defect detection processing in step S2506 is defect detection processing by machine learning unlike the defect detection processing by image processing in the first embodiment, and thus the second model of machine learning is used. In step S2507 (corresponding to S708 in FIG. 7), the higher control device 3 estimates a high-picture quality image. This defect observation flow ends when the processing of steps S2505 to S2507 is performed at every defect position.

[3-3. Step S2502 Image Acquisition]

Figure 26:
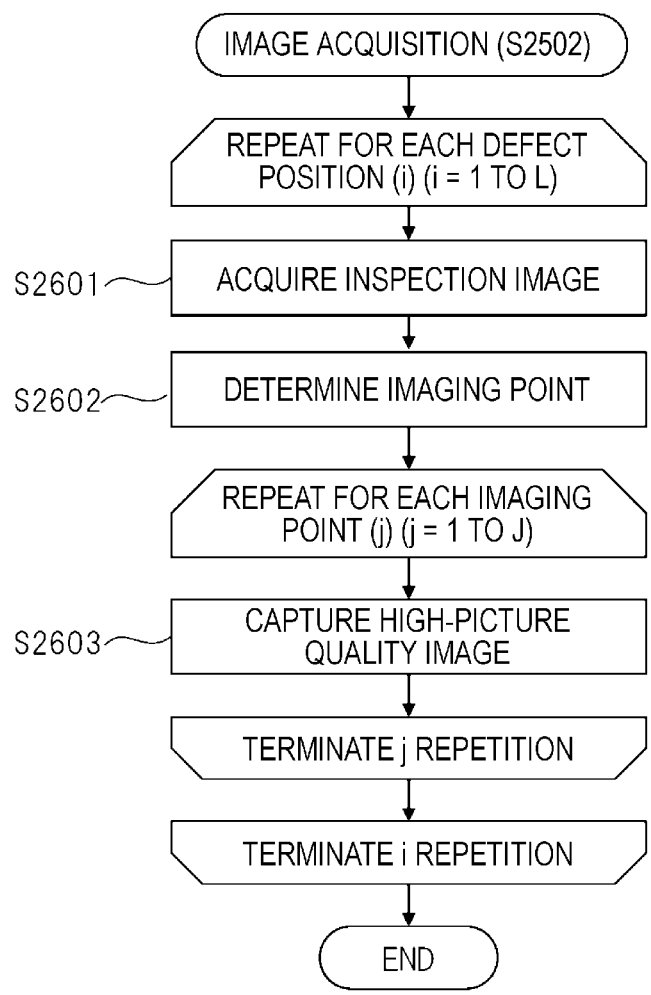
FIG. 26 is a flowchart of image acquisition step S2502 in the third embodiment.

FIG. 26 illustrates the flow of the image acquisition processing in step S2502. The higher control device 3 performs this image acquisition processing using the inspection image acquisition unit 205 and the high-picture quality image acquisition unit 2301. The sample observation device 1 of the third embodiment requires a defect part-including inspection image and a plurality of high-picture quality images having an imaging range determined so as to image the entire imaging range of an inspection image for each defect position (i) of the defect position information 8. Accordingly, those images are acquired in step S2502.

In the third embodiment, the imaging count (N) is determined by the ratio of the sizes of the imaging ranges (i.e. field of view ranges) of an inspection image and a high-picture quality image (described later). Accordingly, in image acquisition step S2502, imaging count (N) determination by a user is not necessary. In this step S2502, the loop processing of steps S2601 to S2603 is executed for each defect position (i) of the defect position information 8.

In inspection image acquisition step S2601 (corresponding to S903 in FIG. 9), the higher control device 3 uses the inspection image acquisition unit 205 to acquire the inspection image of the defect position (i) under the first imaging condition stored in the imaging parameter storage unit 213. Step S2601 is the same as step S706 described above. The acquired image is stored in the image storage unit 210.

Subsequently, in step S2602, the higher control device determines the imaging point (j) of the high-picture quality image using the imaging point determination unit 2302. In this step S2602, unlike in the first and second embodiments, the higher control device 3 determines the minimum number of imaging points (j) at which the entire imaging range of the inspection image can be imaged. Details of step S2602 will be described later.

After the imaging point (j) is determined, in step S2603 (corresponding to S906 in FIG. 9), the higher control device 3 uses the high-picture quality image capturing unit 209 to capture a high-picture quality image at the imaging point (j) corresponding to the defect position (i) under the second imaging condition stored in the imaging parameter storage unit 213. The captured high-picture quality image is stored in the image storage unit 210. This image acquisition flow ends when the processing of steps S2601 to S2603 is completed at every defect position.

[3-4. Step S2602 Imaging Point Determination]

Figure 27:
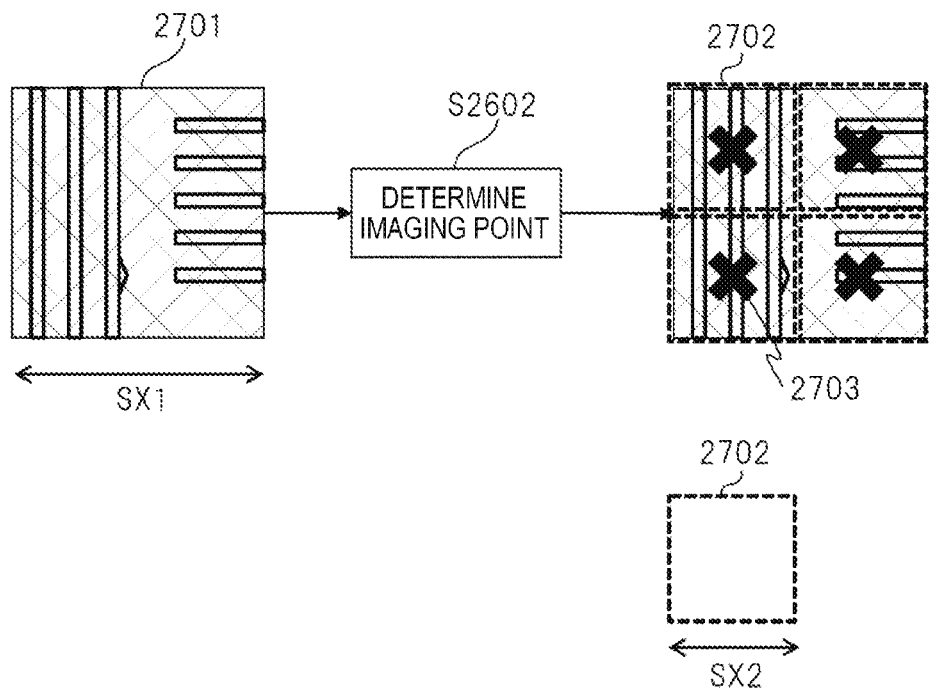
FIG. 27 is an explanatory diagram related to imaging point determination processing in the third embodiment.

FIG. 27 is an explanatory diagram related to the imaging point determination processing of step S2602 in the third embodiment. FIG. 27 illustrates an example in which the size ratio of the imaging ranges (field of view ranges) in the inspection image and the high-picture quality image is 2. In this example, an inspection image 2701 is a square, and the horizontal size (representable by pixel count) is indicated by SX1. The high-picture quality image (indicated by broken line) is a square and the horizontal size is SX2, which is half of SX1. For example, the size proportion is SX1:SX2 and the size ratio is SX1/SX2=2.

In the case of imaging point determination using the inspection image 2701 of FIG. 27, the higher control device 3 configures a region 2702 where the length and width of the inspection image 2701 are each divided by the same number as the size ratio (=2). In this example, four regions 2702 covering the entire region of the inspection image 2701 are configured. Then, the higher control device 3 determines a plurality of (four) imaging points (j) 2703 indicated by x such that the regions 2702 can be imaged as high-picture quality image regions.

[3-5. Step S2506 Defect Detection]

Figure 28:
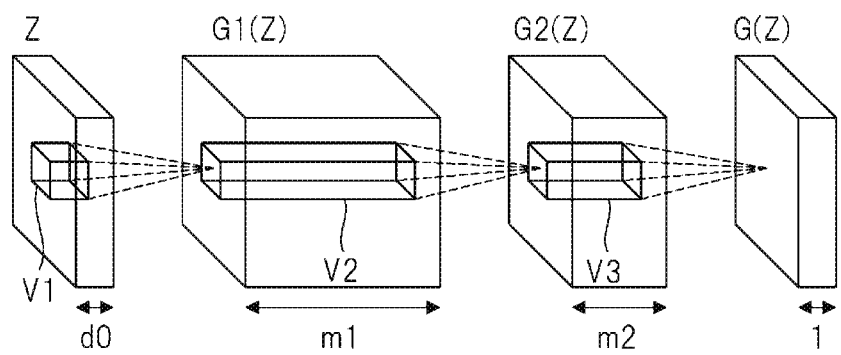
FIG. 28 is an explanatory diagram illustrating a model configuration example in the third embodiment.

FIG. 28 is an explanatory diagram related to the defect detection processing of step S2506. In the defect detection processing of the third embodiment, inspection image defect detection is performed using a machine learning model. Known deep learning is used as a machine learning implementation method for the defect detection in the third embodiment. Specifically, a CNN as in FIG. 28 is used. In the defect detection in the third embodiment, a defect detection result image (G(Z)) is an output. The defect detection result image is a binary image indicating a region detected as a defect. In the case of an 8-bit grayscale image, for example, the pixel value of the defect detection region is 255 and the pixel value of the other region is 0. The output defect detection result image is stored in the image storage unit 210.

In FIG. 28, Z is an input inspection image and G(Z) is a defect detection result image that is an output as an estimation result. In addition, G1(Z) and G2(Z) indicate intermediate data between the input and the estimation result. The intermediate data G1(Z), the intermediate data G2(Z), and the defect detection result image G(Z) as an estimation result are calculated by the following Equations 4 to 6.

$$G1(Z)=\max(0, V1*Z+A1) \quad \text{Equation 4:}$$

$$G2(Z)=\max(0, V2*G1(Z)+A2) \quad \text{Equation 5:}$$

$$G(Z)=V3*G2(Z)+A3 \quad \text{Equation 6:}$$

Here, the symbol * indicates a convolution operation, V1 indicates m1 filters with a size of d0×g1×g1, d0 indicates an input image channel count, and g1 indicates the size of the spatial filter. An m1-dimensional feature map can be obtained by convolving the d0×g1×g1 size filter m1 times in the input image Z. A1 is an m1-dimensional vector and a bias component corresponding to the m1 filters. Likewise, V2 is a m2 filter with a size of m1×g2×g2, A2 is an m2-dimensional vector, V3 is a filter with a size of m2×g3×g3, and A3 is a one-dimensional vector. g1, g2, m1, and m2 are values determined by a user before the defect detection. For example, g1 may be 9, g2 may be 5, m1 may be 128, and m2 may be 64.

In the parameter adjustment unit 2304 in the third embodiment, the model parameters to be adjusted are V1, V2, V3, A1, A2, and A3. The configuration of the CNN is not limiting.

[3-6. Step S2504 Parameter Adjustment]

FIG. 29 illustrates a flow related to the defect detection parameter adjustment processing of step S2504. FIG. 29 includes steps S2801 to S2805. In the parameter adjustment in the third embodiment, first, in order to determine a detailed defect position in the inspection image of the defect position (i), high-picture quality inspection image selection step S2801 and defect discrimination step S2802 are performed on the imaging point (j) of the high-picture quality image. In step S2801, only high-picture quality image selection processing is performed since a high-picture quality image corresponding to the entire region of the inspection image is acquired in image acquisition step S2502. In step S2802, the higher control device 3 performs defect discrimination processing using a high-picture quality inspection image. In the defect discrimination processing in the third embodiment, the defect detection unit 2303 acquires a defect detection result image corresponding to the high-picture quality inspection image using the high-picture quality inspection image. At this time, the defect detection parameter is not yet to be adjusted with respect to the target manufacturing process. Accordingly, for example, the defect detection processing is applied to the high-picture quality inspection image using a defect detection parameter previously adjusted in a different manufacturing process.

In step S2803 (corresponding to S1404 in FIG. 14), the higher control device 3 performs the processing of determining a defect position in an inspection image using the defect detection result image of the high-picture quality inspection image obtained in step S2802. In step S2804, the higher control device 3 creates a defect detection result image corresponding to the inspection image using the detailed defect position on the inspection image determined in step S2803. The created defect detection result image is stored in the image storage unit 210.

After creating the corresponding defect detection result image for every inspection image, finally, in step S2805 (corresponding to S1406 in FIG. 14), the higher control device 3 adjusts the defect detection parameter using the model described above and using the inspection image as an input and the defect detection result image as an estimation result. In the processing using the CNN of FIG. 28 in this step 2805, various methods can be applied and efficiency or the like can be enhanced as in the processing using the CNN of FIG. 13 described above. After the learning of the neural network is completed, the higher control device 3 stores the defect detection parameter in the defect detection parameter storage unit 211 as an adjustment result. Then, the flow of this parameter adjustment ends.

[3-7. Effect, etc.]

As described above, according to the third embodiment, learning of a high-picture quality image estimation model in which no reference image is acquired and parameter adjustment are performed, and thus reference image acquisition can be omitted and the throughput of the sample observation device can be improved.

Although the present invention has been specifically described above based on the embodiments, the present invention is not limited to the embodiments and can be variously modified without departing from the gist.

What is claimed is:

1. A sample observation device comprising:
   an imaging device; and
   a processor executing learning processing for learning a high-picture quality image estimation model and sample observation processing for performing defect detection, wherein
   (A) in the learning processing:
   (A1) one or more learning defect positions related to a learning sample are acquired;
   (A2) a low-picture quality learning image under a first imaging condition is acquired for each of the learning defect positions;
   (A3) a first set value related to an imaging count of a high-picture quality learning image is acquired;
   (A4) for each of the learning defect positions;
   (A4a) the imaging count of the high-picture quality learning image is determined based on the first set value;
   (A4b) one or more imaging points as positions where the high-picture quality learning image is captured are determined based on the imaging count determined in (A4a);
   (A4c) the high-picture quality learning image under a second imaging condition is acquired for each of the one or more imaging points determined in (A4b);
   (A5) the high-picture quality image estimation model is learned using the low-picture quality learning image and the high-picture quality learning image; and
   (A6) a defect detection parameter is adjusted using the high-picture quality image estimation model, and (B) in the sample observation processing, based on the adjusted defect detection parameter:
(B1) a first inspection image of a defect position of an observation target sample is acquired under the first imaging condition; and
(B2) a defect candidate of the observation target sample is detected based on the first inspection image, wherein
the processor in determining the imaging point:
determines, based on a feature quantity of a defect candidate in the low-picture quality learning image, a priority of each of the defect candidates;
selects, based on the priority of each of the defect candidates, a plurality of defect candidates to be imaged under the second imaging condition from a plurality of defect candidates of the low-picture quality learning image so as to be equal to or less than the imaging count; and
determines the imaging point for imaging the plurality of selected defect candidates.

2. The sample observation device according to claim 1, wherein
the processor sets the first set value related to the imaging count based on user input.

3. The sample observation device according to claim 1, wherein
in a case where several defect candidates are mutually close in the low-picture quality learning image, the processor in determining the imaging point determines the imaging point such that a region centered on the imaging point is one region including the several defect candidates.

4. A sample observation device comprising:
an imaging device; and
a processor executing learning processing for learning a high-picture quality image estimation model and sample observation processing for performing defect detection, wherein
(A) in the learning processing:
(A1) one or more learning defect positions related to a learning sample are acquired;
(A2) a low-picture quality learning image under a first imaging condition is acquired for each of the learning defect positions;
(A3) a first set value related to an imaging count of a high-picture quality learning image is acquired;
(A4) for each of the learning defect positions;
(A4a) the imaging count of the high-picture quality learning image is determined based on the first set value;
(A4b) one or more imaging points as positions where the high-picture quality learning image is captured are determined based on the imaging count determined in (A4a);
(A4c) the high-picture quality learning image under a second imaging condition is acquired for each of the one or more imaging points determined in (A4b);
(A5) the high-picture quality image estimation model is learned using the low-picture quality learning image and the high-picture quality learning image; and
(A6) a defect detection parameter is adjusted using the high-picture quality image estimation model, and
(B) in the sample observation processing, based on the adjusted defect detection parameter:
(B1) a first inspection image of a defect position of an observation target sample is acquired under the first imaging condition; and
(B2) a defect candidate of the observation target sample is detected based on the first inspection image, wherein
in the learning processing:
a defect-free learning reference image associated with the low-picture quality learning image is acquired under the first imaging condition for each of the learning defect positions; and
the model is learned using the learning reference image, and
in the sample observation processing:
a defect-free first reference image associated with the first inspection image is acquired under the first imaging condition for each defect position of the observation target sample; and
a position and a feature quantity of the defect candidate are calculated based on comparison between the first inspection image and the first reference image.

5. The sample observation device according to claim 4, wherein
the processor:
in acquiring the learning reference image, acquires the learning reference image by performing imaging with the imaging device under the first imaging condition; and
in acquiring the first reference image, acquires the first reference image by performing imaging with the imaging device under the first imaging condition.

6. The sample observation device according to claim 4, wherein
the processor:
in acquiring the learning reference image, combines the learning reference image from the low-picture quality learning image; and
in acquiring the first reference image, combines the first reference image from the first inspection image.

7. The sample observation device according to claim 4, wherein
the processor in adjusting the defect detection parameter:
crops an image with regard to the defect candidate from the low-picture quality learning image;
estimates the high-picture quality learning image from the cropped image using the high-picture quality image estimation model or selects a high-picture quality learning image including the defect candidate from the acquired high-picture quality learning image;
estimates the learning reference image using the high-picture quality image estimation model with regard to a position associated with the defect candidate from the learning reference image or combines the learning reference image from the high-picture quality learning image;
determines a defect position in the high-picture quality learning image by discriminating whether or not the defect candidate is a defect using the high-picture quality learning image and the learning reference image; and
selects a parameter capable of detecting the determined defect position based on evaluation.

8. The sample observation device according to claim 7, wherein
the processor causes a screen to display the low-picture quality learning image, the high-picture quality learning image, a result of estimation of a high-picture quality inspection image from the first inspection image by the high-picture quality image estimation model, a result of the adjustment of the defect detection parameter, and a defect position corresponding to a detected defect candidate in the first inspection image after the adjustment of the defect detection parameter.

9. A sample observation method in a sample observation device including an imaging device and a processor executing learning processing for learning a high-picture quality image estimation model and sample observation processing for performing defect detection, wherein the method comprises:
as steps executed by the sample observation device,
(A) in the learning processing:
(A1) one or more learning defect positions related to a learning sample is acquired;
(A2) a low-picture quality learning image under a first imaging condition is acquired for each of the learning defect positions;
(A3) a first set value related to an imaging count of a high-picture quality learning image is acquired;
(A4) for each of the learning defect positions;
(A4a) the imaging count of the high-picture quality learning image is determined based on the first set value;
(A4b) one or more imaging points as positions where the high-picture quality learning image is captured are determined based on the imaging count determined in (A4a);
(A4c) the high-picture quality learning image under a second imaging condition is acquired for each of the one or more imaging points determined in (A4b);
(A5) the high-picture quality image estimation model is learned using the low-picture quality learning image and the high-picture quality learning image; and
(A6) a defect detection parameter is adjusted using the high-picture quality image estimation model, and
(B) in the sample observation processing, based on the adjusted defect detection parameter:
(B1) a first inspection image of a defect position of an observation target sample is acquired under the first imaging condition; and
(B2) a defect candidate of the observation target sample is detected based on the first inspection image, wherein the determining of the imaging point further comprises
determining, based on a feature quantity of a defect candidate in the low-picture quality learning image, a priority of each of the defect candidates;
selecting, based on the priority of each of the defect candidates, a plurality of defect candidates to be imaged under the second imaging condition from a plurality of defect candidates of the low-picture quality learning image so as to be equal to or less than the imaging count; and
determining the imaging point for imaging the plurality of selected defect candidates.

10. The sample observation method according to claim 9, further comprising:
setting, by the processor, the first set value related to the imaging count based on user input.

11. The sample observation method according to claim 9, wherein
in a case where several defect candidates are mutually close in the low-picture quality learning image, the determining of the imaging point further comprises determines the imaging point such that a region centered on the imaging point is one region including the several defect candidates.

12. The sample observation method according to claim 9, wherein
the learning processing further comprises
acquiring a defect-free learning reference image associated with the low-picture quality learning image under the first imaging condition for each of the learning defect positions; and
updating the model using the learning reference image; and
the sample observation processing further comprises
acquiring a defect-free first reference image associated with the first inspection image under the first imaging condition for each defect position of the observation target sample; and
calculating a position and a feature quantity of the defect candidate based on comparison between the first inspection image and the first reference image.

13. The sample observation device according to claim 12, wherein
the acquiring of the learning reference image further comprises acquiring the learning reference image by performing imaging with the imaging device under the first imaging condition; and
the acquiring of the first reference image further comprises acquiring the first reference image by performing imaging with the imaging device under the first imaging condition.

14. The sample observation method according to claim 12, wherein
the acquiring of the learning reference image further comprises combining the learning reference image from the low-picture quality learning image; and
he acquiring of the first reference image further comprises combining the first reference image from the first inspection image.

15. The sample observation method according to claim 12, wherein adjusting the defect detection parameter further comprises:
cropping an image with regard to the defect candidate from the low-picture quality learning image;
estimating the high-picture quality learning image from the cropped image using the high-picture quality image estimation model or selects a high-picture quality learning image including the defect candidate from the acquired high-picture quality learning image;
estimating the learning reference image using the high-picture quality image estimation model with regard to a position associated with the defect candidate from the learning reference image or combines the learning reference image from the high-picture quality learning image;
determining a defect position in the high-picture quality learning image by discriminating whether or not the defect candidate is a defect using the high-picture quality learning image and the learning reference image; and
selecting a parameter capable of detecting the determined defect position based on evaluation.

16. The sample observation method according to claim 15, further comprising:
displaying the low-picture quality learning image, the high-picture quality learning image, a result of estimation of a high-picture quality inspection image from the first inspection image by the high-picture quality image estimation model, a result of the adjustment of the defect detection parameter, and a defect position corresponding to a detected defect candidate in the first inspection image after the adjustment of the defect detection parameter.

* * * * *